United States Patent
Miyahara et al.

(10) Patent No.: US 12,441,842 B2
(45) Date of Patent: Oct. 14, 2025

(54) POLYIMIDE RESIN, PHOTOSENSITIVE RESIN COMPOSITION, RESIN FILM, AND ELECTRONIC DEVICE

(71) Applicant: MITSUBISHI GAS CHEMICAL COMPANY, INC., Tokyo (JP)

(72) Inventors: Daichi Miyahara, Okayama (JP); Yumi Sato, Okayama (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 659 days.

(21) Appl. No.: 17/790,194

(22) PCT Filed: Dec. 15, 2020

(86) PCT No.: PCT/JP2020/046718
§ 371 (c)(1),
(2) Date: Jun. 30, 2022

(87) PCT Pub. No.: WO2021/140845
PCT Pub. Date: Jul. 15, 2021

(65) Prior Publication Data
US 2023/0094840 A1  Mar. 30, 2023

(30) Foreign Application Priority Data
Jan. 8, 2020  (JP) .................. 2020-001511

(51) Int. Cl.
*G03F 7/037* (2006.01)
*C08G 73/10* (2006.01)
*C09D 179/08* (2006.01)

(52) U.S. Cl.
CPC ......... *C08G 73/105* (2013.01); *C09D 179/08* (2013.01); *G03F 7/037* (2013.01)

(58) Field of Classification Search
CPC .......... G03F 7/004; G03F 7/028; G03F 7/037; C08G 73/10; C08G 73/105; C08G 73/1078; C08G 73/1007; C08G 73/101
See application file for complete search history.

(56) References Cited

U.S. PATENT DOCUMENTS

| | | |
|---|---|---|
| 2004/0235992 A1 | 11/2004 | Okada et al. |
| 2006/0110678 A1 | 5/2006 | Dueber et al. |
| 2006/0110679 A1 | 5/2006 | Dueber et al. |
| 2017/0044322 A1 | 2/2017 | Noguchi et al. |
| 2018/0237638 A1* | 8/2018 | Matsuo .................. C08G 73/10 |
| 2022/0252979 A1* | 8/2022 | Sato .................... C08G 73/1042 |

FOREIGN PATENT DOCUMENTS

| | | |
|---|---|---|
| CN | 102807675 A | 12/2012 |
| JP | 11-52572 | 2/1999 |
| JP | 2000-147768 A | 5/2000 |
| JP | 2003-168800 A | 6/2003 |
| JP | 2005-15629 A | 1/2005 |
| JP | 2006-146244 A | 6/2006 |
| JP | 2007-108761 A | 4/2007 |
| JP | 2014-24894 A | 2/2014 |
| JP | 2015-134842 A | 7/2015 |
| WO | 2015/163314 A1 | 10/2015 |
| WO | 2017/030019 A1 | 2/2017 |

OTHER PUBLICATIONS

Machine translation of JP 2014-24894 (no date) (Year: 0000).*
Machine translation of CN 102807675 (no date) (Year: 0000).*

* cited by examiner

*Primary Examiner* — Amanda C. Walke
(74) *Attorney, Agent, or Firm* — GREENBLUM & BERNSTEIN P.L.C.

(57) ABSTRACT

A modified polyimide resin containing a structure represented by general formula (I) below. A polyimide resin containing: a structural unit A derived from a tetracarboxylic dianhydride; and a structural unit B derived from a diamine compound, wherein the structural unit A contains a structural unit derived from a compound having a specific structure in a proportion of 60 mol % or greater.

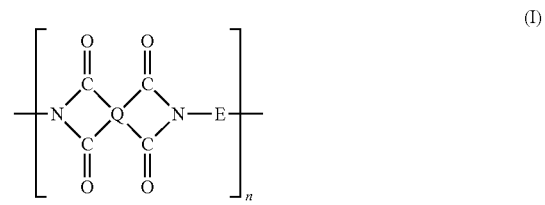

(I)

22 Claims, No Drawings

POLYIMIDE RESIN, PHOTOSENSITIVE RESIN COMPOSITION, RESIN FILM, AND ELECTRONIC DEVICE

TECHNICAL FIELD

The present invention relates to a polyimide resin, a photosensitive resin composition, a resin film, and an electronic device.

BACKGROUND ART

Generally, a polyimide resin produced from a reaction between a tetracarboxylic dianhydride and a diamine has excellent properties such as heat resistance, mechanical properties, electrical characteristics, and chemical resistance, and has been widely used in the electric and electronic industry fields and the like. However, since many aromatic polyimide resins have poor solubility in an organic solvent, usually, a polyamic acid solution, which is a polyimide precursor, is applied, and subjected to dehydration and ring closure by high temperature heating to form a polyimide. Imidization by dehydration and ring closure involves desorption and evaporation of water, and the temperature at the time of thermal imidization reaches as high as 180 to 400° C., so that defects are likely to occur, there is a problem in workability, and applications are limited.

One method for solving the above problem is to use an organic solvent-soluble polyimide. The organic solvent-soluble polyimide can be processed only by volatilizing the organic solvent, and many studies have been made, but the processing is mainly performed by devising a polymerization component. One of the methods for improving solubility is introduction of an alicyclic structure. For example, a polyimide resin containing a 1,2,4,5-cyclohexanetetracarboxylic acid skeleton is disclosed (refer to Patent Documents 1 and 2). Patent Document 1 discloses a polyimide resin containing a 1,2,4,5-cyclohexanetetracarboxylic acid skeleton and having sufficiently high solubility in an organic solvent. Patent Document 2 discloses a method for producing a solvent-soluble polyimide by polycondensation of an aliphatic tetracarboxylic dianhydride, an aliphatic tetracarboxylic acid, or a derivative thereof, and a diamine compound in a solvent. In addition, a solvent-soluble polyimide formed by copolymerization of a specific alicyclic tetracarboxylic dianhydride with an alicyclic diamine and an aromatic diamine is also disclosed (refer to Patent Document 3). On the other hand, Patent Document 4 discloses a polyimide resin containing specific aromatic diamine 4,4'-oxybis[3-(trifluoromethyl) benzenamine] (6FODA) and having sufficiently high solubility in an organic solvent.

CITATION LIST

Patent Documents

Patent Document 1: JP 2003-168800 A
Patent Document 2: JP 2005-15629 A
Patent Document 3: JP 2015-134842 A
Patent Document 4: CN 102807675 A

SUMMARY OF INVENTION

Technical Problem

A photosensitive polyimide resin having excellent heat resistance and insulating properties has been widely used in a surface protective film and an interlayer insulating film of a semiconductor element for an electronic device, and used in a wiring protection insulating film for a circuit board and the like. An insulating material such as a semiconductor integrated circuit has been required to have more pattern developability than ever before in photolithography from the viewpoint of higher density and higher integration in recent years, and it is important to increase a difference in solubility between an exposed portion and an unexposed portion. Thus, a polyimide resin as a base has been required to have high solvent solubility. In the polyimide resin of Patent Documents 1 to 4 described above, the solvent solubility is insufficient, and further improvements are necessary.

In view of the above circumstances, an object of the present invention is to provide a polyimide resin having excellent solvent solubility, a photosensitive resin composition containing the polyimide resin, a resin film thereof, and an electronic device including the resin film.

Solution to Problem

As a result of diligent research to solve the above-described problems, the present inventors have found that a polyimide resin having better solvent solubility than ever before can be obtained by using a specific tetracarboxylic acid anhydride and a specific diamine compound as a polyimide resin raw material.

That is, the present invention provides a polyimide resin, a photosensitive resin composition, a resin film, and an electronic device.

[1] A modified polyimide resin comprising a structure represented by General Formula (I) below,

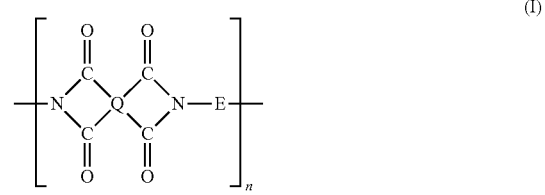

in General Formula (I), E has at least one group selected from the group consisting of an aliphatic hydrocarbon group, cycloaliphatic hydrocarbon group, aromatic hydrocarbon group, and organosiloxane group, and is a divalent group having from 2 to 39 carbon atoms; Q may contain 60 mol % or greater of the structure represented by the following general formula (II), and may contain a tetravalent group having 4 or more and 10 or less carbon atoms with a cyclic structure, an acyclic structure, or a cyclic structure and a acyclic structure, in addition to the structure represented by the general formula (II); n represents the number of repeating units; a terminal end in the general formula (I) is either a group represented by Formula (III) or Formula (IV) below, or a hydrogen atom, and at least one of the terminal ends is a group represented by Formula (III) or Formula (IV); and

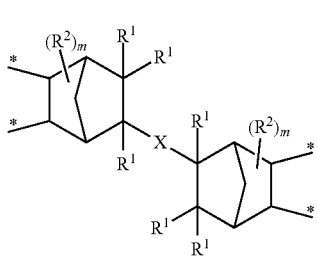

(II)

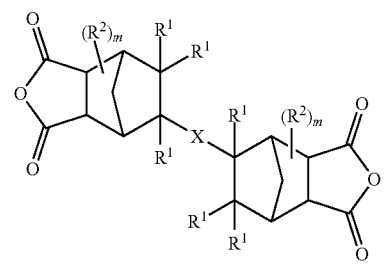

(I)

in General Formula (II), X represents a single bond, and one type selected from the group consisting of a divalent aromatic hydrocarbon group having from 6 to 30 carbon atoms; the divalent aromatic hydrocarbon group represented by X may be substituted with a substituent, and the number of carbon atoms represents the number of carbon atoms forming an aromatic ring; in a case where X is a single bond, a plurality of $R^1$s each independently represent a hydrogen atom, an alkyl group having from 1 to 10 carbon atoms, a hydroxyl group, or a nitro group, or two $R^1$ groups bonded to the same carbon atom represent a methylidene group ($=CH_2$); in a case where X is a divalent aromatic hydrocarbon group, a plurality of $R^1$s each independently represent at least one type selected from the group consisting of a hydrogen atom and an alkyl group having from 1 to 10 carbon atoms; a plurality of $R^2$s each independently represent a hydrogen atom or an alkyl group having from 1 to 10 carbon atoms; and m represents an integer from 0 to 4; and * represents an atomic bond in General Formula (I), X represents a single bond, and one type selected from the group consisting of a divalent aromatic hydrocarbon group having from 6 to 30 carbon atoms; the divalent aromatic hydrocarbon group represented by X may be substituted with a substituent, and the number of carbon atoms represents the number of carbon atoms forming an aromatic ring; in a case where X is a single bond, a plurality of $R^1$s each independently represent a hydrogen atom, an alkyl group having from 1 to 10 carbon atoms, a hydroxyl group, or a nitro group, or two $R^1$ groups bonded to the same carbon atom represent a methylidene group ($=CH_2$); in a case where X is a divalent aromatic hydrocarbon group, a plurality of $R^1$s each independently represent at least one type selected from the group consisting of a hydrogen atom and an alkyl group having from 1 to 10 carbon atoms; a plurality of $R^2$s each independently represent a hydrogen atom or an alkyl group having from 1 to 10 carbon atoms; and m represents an integer from 0 to 4.

[6] The polyimide resin according to the above [5], in which the structural unit B contains a structural unit B1 derived from at least one compound selected from the group consisting of a compound represented by the following formula.

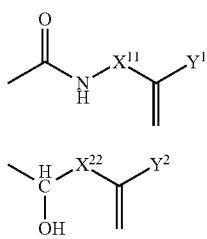

(III)

(IV)

in General Formula (III) and (IV), $X^{11}$ and $X^{22}$ are each independently a group having from 2 to 15 carbon atoms and may have at least one group selected from the group consisting of an ester bond and a double bond; and $Y^1$ and $Y^2$ are each independently a hydrogen atom or a methyl group.

[2] The modified polyimide resin according to the above [1], in which a weight average molecular weight of the modified polyimide resin is 70000 or less.

[3] The modified polyimide resin according to the above [1] or [2], in which the weight average molecular weight of the modified polyimide resin is 5000 or greater.

[4] The modified polyimide resin according to any one of the above [1] to [3], in which a light transmittance at a wavelength from 200 to 400 nm of the modified polyimide resin is 50% or greater.

[5] A polyimide resin for a photosensitive resin composition, containing: a structural unit A derived from a tetracarboxylic dianhydride; and a structural unit B derived from a diamine compound, in which the structural unit A contains a structural unit derived from a compound represented by Formula (1) below in a proportion of 60 mol % or greater,

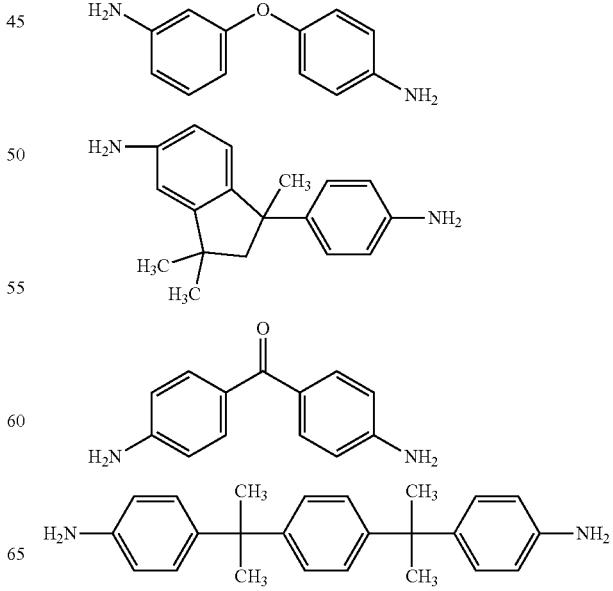

-continued

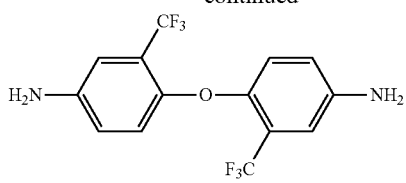

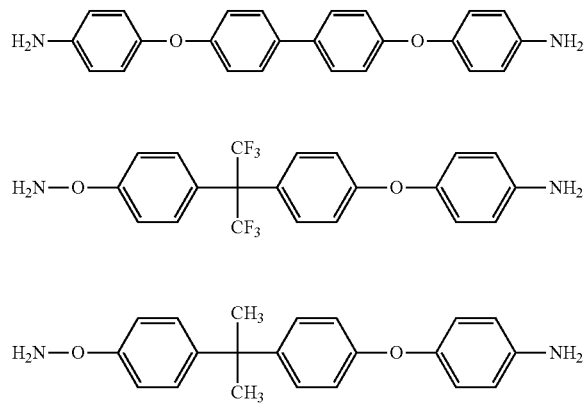

[7] The polyimide resin according to the above [5] or [6], in which the structural unit B contains a structural unit B2 derived from at least one compound selected from the group consisting of a compound represented by the following formula.

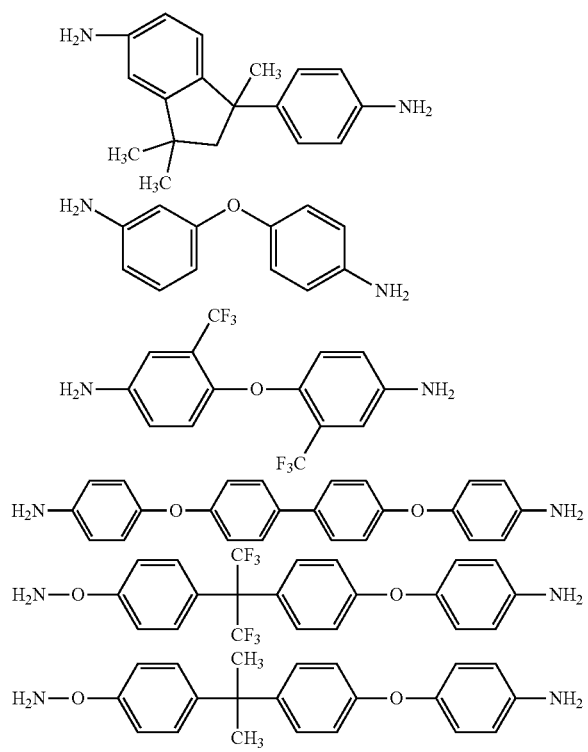

[8] The polyimide resin according to the above [7], in which the structural unit B2 includes a structural unit derived from a compound represented by Formula (2).

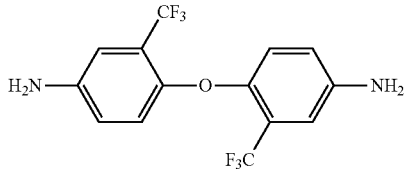

(2)

[9] The polyimide resin according to any one of the above [6] to [8], in which 60 mol % or greater of the structural unit B1 or the structural unit B2 is contained as the structural unit B.

[10] The polyimide resin according to any one of the above [5] to [9], in which a weight average molecular weight is 70000 or less.

[11] A polyimide varnish containing at least one polyimide resin selected from the modified polyimide resin according to any one of the above [1] to [4] and the polyimide resin according to any one of the above [5] to [10], and an organic solvent.

[12] A molded body formed by molding the polyimide varnish described in the above [11].

[13] The molded body according to the above [12], which in the molded body is in a membrane shape, a film shape, or a sheet shape.

[14] A photosensitive resin composition containing: at least one polyimide resin selected from the modified polyimide resin (A) according to any one of the above [1] to [4] and the polyimide resin according to any one of the above [5] to [10]; and at least one (B) selected from the group consisting of a photopolymerization initiator, a solvent, and a photopolymerizable compound.

[15] The photosensitive resin composition according to the above [14], in which the photopolymerizable compound contains a polyfunctional radical polymerizable monomer.

[16] The photosensitive resin composition according to the above [14] or [15], further containing a sensitizer.

[17] The photosensitive resin composition according to any one of the above [14] to [16], in which a residual film ratio of an unexposed portion is 40% or less, after exposure to light of a high-pressure mercury lamp excluding light having a wavelength of less than 365 nm under a condition of an exposure amount being from 1500 to 2500 mJ/cm$^2$.

[18] The photosensitive resin composition according to any one of [14] to [17], in which the photosensitive resin composition is used for forming an insulating film.

[19] A resin film containing the photosensitive resin composition according to any one of the above [14] to [18] or a cured product of the photosensitive resin composition.

[20] The resin film according to the above [19], in which a thickness of the film is 10 to 85 μm.

[21] An electronic device including the resin film according to the above [20].

Advantageous Effects of Invention

According to the present invention, it is possible to produce a polyimide resin having excellent solvent solubility, a photosensitive resin composition containing the polyimide resin, a resin film thereof, and an electronic device including the resin film.

DESCRIPTION OF EMBODIMENTS

Hereinafter, embodiments for carrying out the present invention (hereinafter, referred to simply as "the present embodiment") will be described in detail. The following embodiments are examples for explaining the present invention, and do not limit the contents of the present invention. The present invention can be modified as appropriate within the scope of the gist. In the present specification, the preferred stipulations can be optionally employed, and combinations of the preferred ones are considered more preferable. In the present specification, "from XX to YY" describes "XX or more and YY or less".

The term "(meth)acrylate" means both "acrylate" and "methacrylate". The same applies to other similar terms ("(meth)acrylic acid", "(meth)acryloyl group", etc.).

[Polyimide Resin]
<Structural Unit A>

The polyimide resin of the present embodiment contains a structural unit A derived from a tetracarboxylic dianhydride; and a structural unit B derived from a diamine compound, in which the structural unit A contains a structural unit derived from a compound represented by Formula (1) in a proportion of 60 mol % or greater,

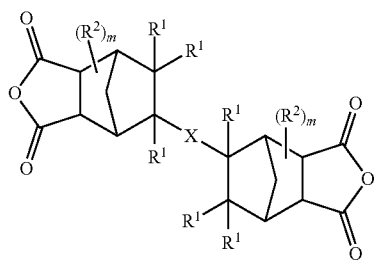

(1)

In General Formula (I), X represents a single bond, and one type selected from the group consisting of a divalent aromatic hydrocarbon group having from 6 to 30 carbon atoms, and preferably a divalent aromatic hydrocarbon group having from 6 to 30 carbon atoms. The divalent aromatic hydrocarbon group represented by X may be substituted with a substituent, and the number of carbon atoms represents the number of carbon atoms forming an aromatic ring. In the case where X is a single bond, a plurality of $R^1$s each independently represent a hydrogen atom, an alkyl group having from 1 to 10 carbon atoms, a hydroxyl group, or a nitro group, or represent a methylidene group ($=CH_2$) by two $R^1$ groups bonded to the same carbon atom. In the case where X is a divalent aromatic hydrocarbon group, a plurality of $R^1$s each independently represent at least one type selected from the group consisting of a hydrogen atom and an alkyl group having from 1 to 10 carbon atoms. A plurality of $R^2$s each independently represent a hydrogen atom or an alkyl group having from 1 to 10 carbon atoms. m represents an integer from 0 to 4.

A divalent aromatic hydrocarbon group having from 6 to 30 carbon atoms, which may be selected as X in General Formula (1) above, may be substituted or unsubstituted. Herein, "from 6 to 30 carbon atoms" indicates the number of carbon atoms that form an aromatic ring, and does not include the number of carbon atoms in the substituent when the divalent aromatic hydrocarbon group has the substituent. When the number of carbon atoms in the divalent aromatic hydrocarbon group is greater than 30, the polyimide tends to develop color when the polyimide resin is formed using the compound represented by Formula (1) as a raw material, which is not preferable. From the viewpoint of transparency and ease of purification, the number of carbon atoms of the divalent aromatic hydrocarbon group is preferably from 6 to 18 and more preferably from 6 to 12.

The divalent aromatic hydrocarbon group is not particularly limited, and for example, an aromatic hydrocarbon group in which two hydrogen atoms are removed from an aromatic compound selected from the group consisting of benzene, naphthalene, anthracene, phenanthrene, triphenylene, pyrene, chrysene, biphenyl, terphenyl, quaterphenyl, and quinquephenyl, a group in which at least one hydrogen atom in the aromatic hydrocarbon group is substituted with a substituent (for example, a 2,5-dimethyl-1,4-phenylene group and a 2,3,5,6-tetramethyl-1,4-phenylene group), and the like can be appropriately used. The position(s) at which the two hydrogen atoms are removed from the aromatic compound is not particularly limited, and for example, in a case where the aromatic hydrocarbon group is a phenylene group, may be any position of the ortho, meta, and para positions. The aromatic compound may have a substituent group, and the divalent aromatic hydrocarbon group derived from the aromatic compound may have a substituent derived from the compound.

The substituent that can be on the divalent aromatic hydrocarbon group in X in Formula (1) above is not particularly limited. Examples thereof include an alkyl group, an alkoxy group, and a halogen atom. Among these substituents, an alkyl group or an alkoxy group having from 1 to 10 carbon atoms is more preferable from the viewpoint of better solvent solubility of the polyimide resin and achieving high processability. In a case where the number of carbon atoms of the substituent is 10 or less, the solvent solubility of the polyimide resin to be formed is not adversely affected, which is preferable. The number of carbon atoms of the alkyl group and the alkoxy group suitable as the substituent is more preferably from 1 to 6, still more preferably from 1 to 5, even more preferably from 1 to 4, and particularly preferably from 1 to 3 from the viewpoint of formation of a polyimide resin having better solvent solubility. The alkyl group and the alkoxy group that can be selected as the substituent may each be linear or branched.

In a case where X in Formula (1) is a single bond, a plurality of R's each independently represent a hydrogen atom, an alkyl group having from 1 to 10 carbon atoms, a hydroxyl group, or a nitro group, or two $R^1$ groups bonded to the same carbon atom represent a methylidene group ($=CH_2$). In a case where X is a divalent aromatic hydrocarbon group, a plurality of R's each independently represent at least one type selected from the group consisting of a hydrogen atom and an alkyl group having from 1 to 10 carbon atoms.

The alkyl group represented by $R^1$ is an alkyl group having from 1 to 10 carbon atoms regardless of the type of X, and may be linear or branched. In a case where the number of carbon atoms of the alkyl group represented by $R^1$ is 10 or less, the solvent solubility of the polyimide resin to be formed is not adversely affected. The number of carbon atoms of the alkyl group represented by $R^1$ is preferably from 1 to 6, more preferably from 1 to 5, still more preferably from 1 to 4, and particularly preferably from 1 to 3 from the viewpoint of formation of a polyimide resin having high solvent solubility.

In a case where X in Formula (1) above is a single bond, as described above, two $R^1$ groups bonded to the same carbon atom among a plurality of $R^1$ in Formula (1) above may be bonded to form a methylidene group ($=CH_2$).

The plurality of R's in Formula (1) are more preferably each independently a hydrogen atom, a methyl group, an ethyl group, a n-propyl group, or an isopropyl group, and still more preferably a hydrogen atom or a methyl group, from the viewpoint of formation of the polyimide with excellent solvent solubility, easy availability of raw materials, and easier purification, regardless of the type of X. A plurality of R's in Formula (1) may be the same or different regardless of the type of X, and are preferably the same from the viewpoint of ease of purification and the like.

The number of carbon atoms of the alkyl group having from 1 to 10 carbon atoms that can be selected as a plurality of $R^2$s in Formula (1) above is preferably from 1 to 6, more preferably from 1 to 5, still more preferably from 1 to 4, and particularly preferably from 1 to 3 from the viewpoint of formation of a polyimide resin having excellent solvent solubility. The alkyl group which may be selected as $R^2$ may be linear or branched.

The plurality of $R^2$s in Formula (1) above are more preferably each independently selected from the group consisting of a hydrogen atom, a methyl group, an ethyl group, a n-propyl group, or an isopropyl group, and particularly preferably a hydrogen atom or a methyl group, from the viewpoint of formation of the polyimide with excellent solvent solubility, easy availability of raw materials, and easier purification. The plurality of $R^2$s in Formula (1) may be the same or different, and are preferably the same from the viewpoint of ease of purification and the like.

In one aspect of the present embodiment, it is particularly preferable that all of a plurality of $R^1$ and $R^2$ in Formula (1) above are hydrogen atoms. When all of a plurality of $R^1$ and $R^2$ in Formula (1) above are hydrogen atoms, the polyimide tends to have excellent solvent solubility, when the polyimide having the compound as a monomer is produced.

Examples of the compound (tetracarboxylic dianhydride) represented by Formula (1) above and in which X is a single bond in Formula (1) include the same compounds as the tetracarboxylic dianhydride disclosed in WO 2017/030019 A. Examples of the compound (tetracarboxylic dianhydride) represented by Formula (1) above and in which X is a divalent aromatic hydrocarbon group in Formula (1) include the same compounds as the tetracarboxylic dianhydride disclosed in WO 2015/163314 A.

The compound represented by Formula (1) above is preferably a compound in which X is the divalent aromatic hydrocarbon group, and a plurality of $R^1$ and $R^2$ in Formula (1) above are both hydrogen atoms; more preferably a compound in which X is an aromatic hydrocarbon group in which two hydrogen atoms are removed from an aromatic compound selected from the group consisting of benzene, naphthalene, anthracene, phenanthrene, triphenylene, pyrene, chrysene, biphenyl, terphenyl, quaterphenyl, and quinquephenyl, and a plurality of $R^1$ and $R^2$ in Formula (1) are both hydrogen atoms; and still more preferably a compound in which X is an aromatic hydrocarbon group in which two hydrogen atoms are removed from benzene, and a plurality of $R^1$ and $R^2$ in Formula (1) above are both hydrogen atoms; and particularly preferably a compound in which X is an aromatic hydrocarbon group in which two hydrogen atoms are removed from the para positions of benzene (that is, a 1,4-phenylene group) and a plurality of $R^1$ and $R^2$ in Formula (1) above are both hydrogen atoms.

The polyimide resin of the present embodiment is required to contain the structural unit derived from the compound represented by Formula (1) above in a proportion of 60 mol % or greater as the structural unit A derived from tetracarboxylic dianhydride. When the proportion of the structural unit derived from the compound represented by Formula (1) in the structural unit A is less than 60 mol %, the solvent solubility of the polyimide resin to be formed is poor.

The proportion of the structural unit derived from the compound represented by Formula (1) in the structural unit A is more preferably 70 mol % or greater, still more preferably 80 mol % or greater, even more preferably 95 mol % or greater, and particularly preferably 100 mol %.

As the tetracarboxylic acid besides the compound represented by Formula (1) contained in the structural unit A, any tetracarboxylic acid can be used. Examples thereof include cyclohexanetetracarboxylic acid, cyclohexanetetracarboxylic esters, cyclohexanetetracarboxylic dianhydride, cyclobutanetetracarboxylic acid, cyclobutanetetracarboxylic esters, cyclobutanetetracarboxylic dianhydride, cyclopentanetetracarboxylic acid, cyclopentanetetracarboxylic esters, cyclopentanetetracarboxylic dianhydrides, and bicyclopentanetetracarboxylic dianhydrides. Of these, cyclohexanetetracarboxylic dianhydride, cyclobutanetetracarboxylic dianhydride, and cyclopentanetetracarboxylic dianhydride are more preferable. Among the above, cyclohexanetetracarboxylic dianhydride is more preferable. The various tetracarboxylic acid components described above include a positional isomer.

More preferred specific examples of the tetracarboxylic acid component described above include 1,2,4,5-cyclohexanetetracarboxylic acid, 1,2,4,5-cyclohexanetetracarboxylic dianhydride, 1,2,4,5-cyclohexanetetracarboxylic acid methyl ester, 1,2,3 4-butanetetracarboxylic acid, 1,2,3,4-butanetetracarboxylic dianhydride, 1,2,3,4-butanetetracarboxylic acid methyl ester, 1,2,3,4-cyclobutanetetracarboxylic acid, 1,2,3,4-cyclobutanetetracarboxylic dianhydride, 1,2,3 4-cyclobutanetetracarboxylic acid methyl ester, 1,2,4, 5-cyclopentanetetracarboxylic acid, 1,2,4,5-cyclopentanetetracarboxylic dianhydride, 1,2,4,5-cyclopentanetetracarboxylic acid methyl ester, 3-carboxymethyl-1,2,4-cyclopentanetricarboxylic acid, bicyclo[2.2.2] octa-7-ene-2, 3,5,6-tetracarboxylic acid, bicyclo[2.2.2] octa-7-ene-2,3,5, 6-tetracarboxylic dianhydride, bicyclo[2.2.2] octa-7-ene-2, 3,5,6-tetracarboxylic acid methyl ester, dicyclohexyltetracarboxylic acid, dicyclohexyltetracarboxylic dianhydride, dicyclohexyltetracarboxylic acid methyl ester.

Among these, 1,2,4,5-cyclohexanetetracarboxylic acid, 1,2,4,5-cyclohexanetetracarboxylic dianhydride, 1,2,3,4-cyclobutanetetracarboxylic dianhydride, and 1,2,4,5-cyclohexanetetracarboxylic acid methyl ester are particularly preferable because they facilitate increase in the molecular weight in production of the polyimide resin and they are advantageous in production of a flexible film.

<Structural Unit B>

The structural unit B is derived from a diamine compound, and examples thereof include at least one selected from the group consisting of compounds represented by the following formula.

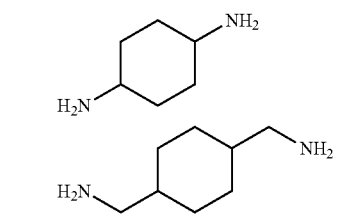

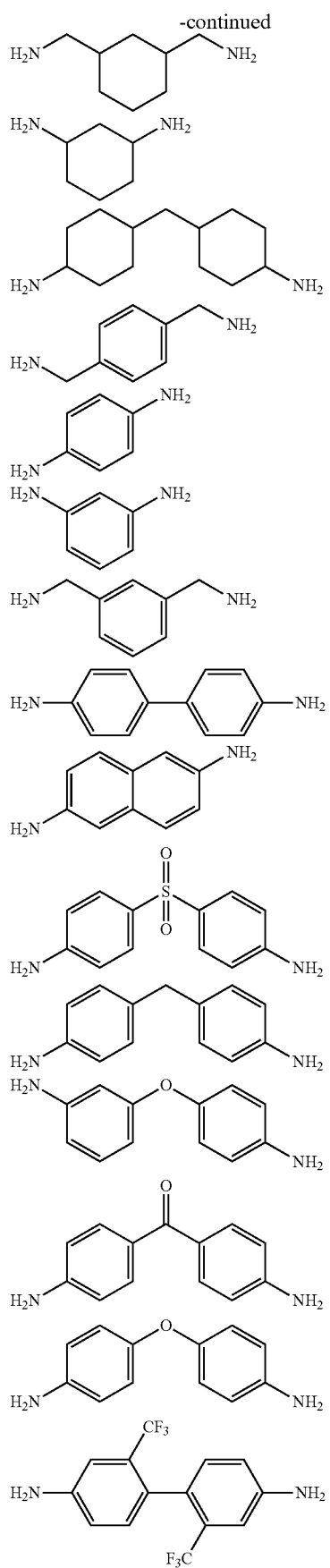
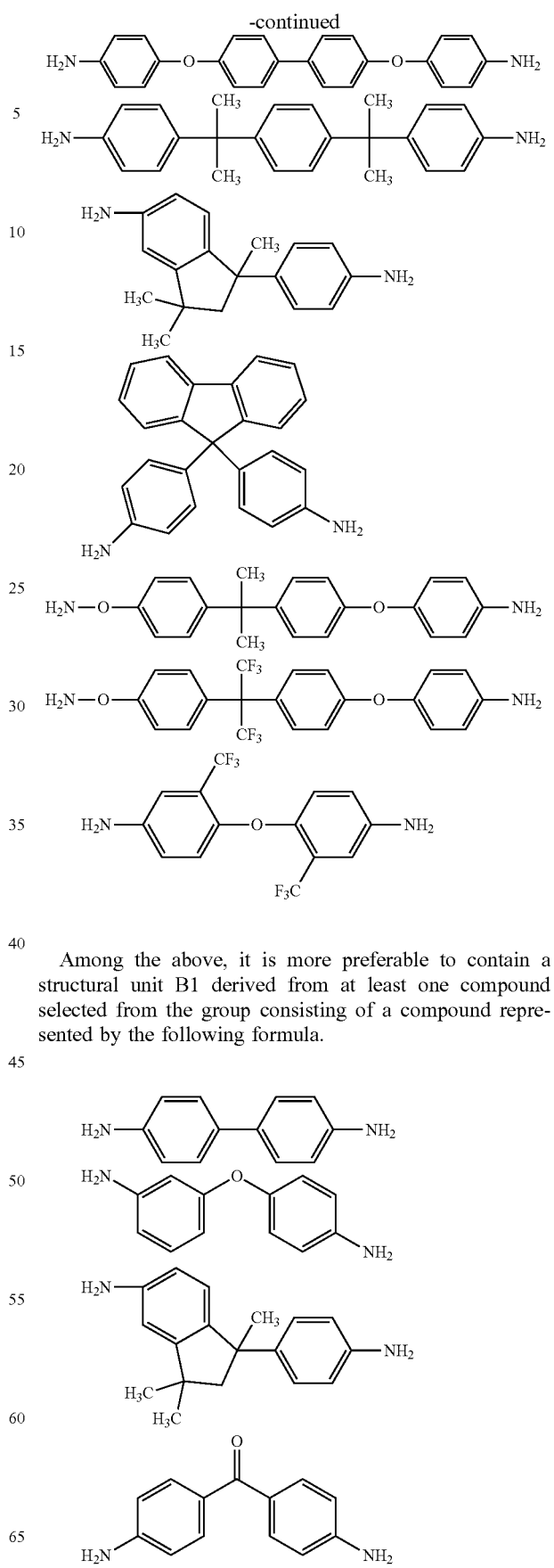
Among the above, it is more preferable to contain a structural unit B1 derived from at least one compound selected from the group consisting of a compound represented by the following formula.

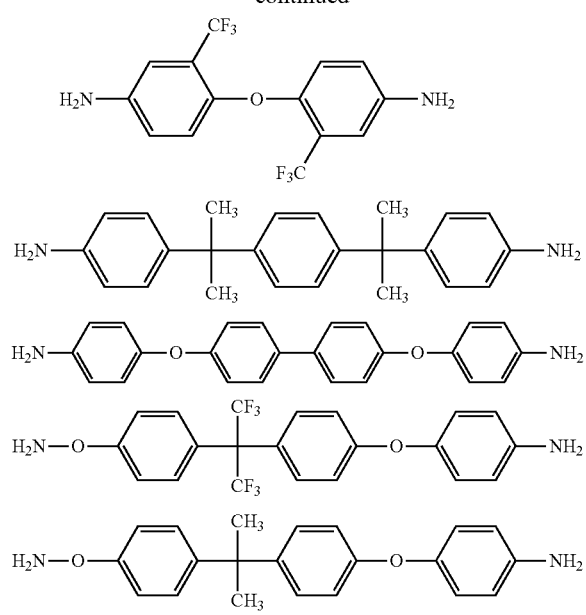

It is further preferable that the structural unit B contains a structural unit B2 derived from at least one compound selected from the group consisting of a compound represented by the following formula.

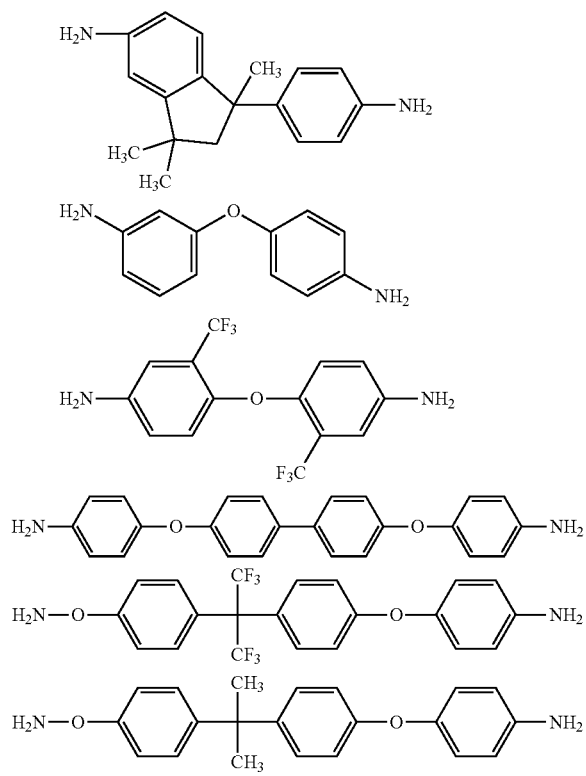

In particular, when the structural unit B2 contains a structural unit derived from a compound represented by Formula (2) below, the polyimide resin to be formed is better in the excellent solvent solubility, which is preferable.

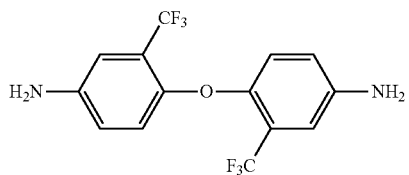

The polyimide resin of the present embodiment preferably contains the structural unit B1 or the structural unit B2 in a proportion of 60 mol % or greater as the structural unit B derived from the diamine. In the structural unit B, when the proportion of the structural unit B1 or the structural unit B2 is 60 mol % or greater, a polyimide resin having the excellent solvent solubility can be produced.

A proportion of the structural unit B1 or the structural unit B2 in the structural unit B is more preferably 70 mol % or greater, still more preferably 80 mol % or greater, even more preferably 95 mol % or greater, and particularly preferably 100 mol %. Among them, preferably, the polyimide resin contains the structural unit B2 as the structural unit B, and the structural unit B2 contains the structural unit derived from the diamine represented by Formula (2) in the above proportion.

A weight average molecular weight of the polyimide resin is preferably 70000 or less. When the weight average molecular weight is 70000 or less, it has better solvent solubility, and thus is suitable for forming a cured film. The weight average molecular weight is preferably 60000 or less, more preferably 50000 or less, still more preferably 45000 or less, even more preferably 40000 or less, even still more preferably 30000 or less. Since a cured film having desired mechanical properties can be formed, the weight average molecular weight of the polyimide resin is preferably 5000 or greater. The weight average molecular weight of the polyimide resin is more preferably 10000 or greater, still more preferably 13000 or greater, and even more preferably 15000 or greater. When the weight average molecular weight of the polyimide resin is within the above range, for example, in a case where the polyimide is used to produce a photosensitive resin composition, a resin composition which has solvent solubility, and also has a low residual film ratio of an unexposed portion and excellent developability, can be produced. Here, the weight average molecular weight is a weight average molecular weight calculated from absolute molecular weight measurement by a GPC-light scattering method.

<Method for Producing Polyimide Resin>

The polyimide resin of the present embodiment contains the structural unit A derived from a tetracarboxylic dianhydride and the structural unit B derived from a diamine compound, and the tetracarboxylic dianhydride and the diamine compound as raw materials are as described above. The polyimide resin of the present embodiment can be formed by allowing the tetracarboxylic acid and the diamine component to react. The polyimide resin of the present embodiment can have an amino group at the terminal end.

An organic solvent used when the tetracarboxylic acid component and the diamine component are reacted is not particularly limited, but an organic solvent containing at least one type selected from the group consisting of cyclic ethers, cyclic ketones, cyclic esters, amides and ureas is preferable. Specific examples of suitable solvents include, but are not limited to, at least one type selected from the group consisting of aprotic polar organic solvents such as γ-butyrolactone, N,N-dimethylacetamide, N,N-dimethylformamide, N-methyl-2-pyrrolidone, dimethyl sulfoxide, hexamethylphosphoramide, cyclopentanone, cyclohexanone, 1,3-dioxolane, 1,4-dioxane, tetramethylurea and tetrahydrofuran. Among these, the solvent may be preferably one or more types selected from the group consisting of γ-butyrolactone, N,N-dimethylacetamide, N,N-dimethylformamide, and N-methyl-2-pyrrolidone.

When the tetracarboxylic acid component and the diamine component are reacted, an imidization catalyst can be used. As the imidization catalyst, a tertiary amine compound is preferable, and specifically, at least one selected from the group consisting of trimethylamine, triethylamine (TEA), tripropylamine, tributylamine, triethanolamine, N,N-dimethylethanolamine, N,N-diethylethanolamine, triethylenediamine, N-methylpyrrolidine, N-ethylpyrrolidine, N-methylpiperidine, N-ethylpiperidine, imidazole, pyridine, quinoline and isoquinoline can be used.

A reaction temperature is, for example, in the range from 160 to 200° C., preferably in the range from 170 to 190° C., and more preferably in the range from 180 to 190° C. When the temperature is 160° C. or higher, imidization and high molecular weight can be more effectively progressed. When the temperature is 200° C. or lower, the solution viscosity can be appropriately maintained, and problems such as caking of the resin on the wall of the reaction vessel can be further avoided. In some cases, azeotropic dehydrating agents such as toluene and xylene may be used. The reaction pressure is usually normal pressure, but if necessary, the reaction can be carried out under pressure. The retention time of the reaction temperature is preferably at least 1 hour or longer, and more preferably 3 hours or longer. A retention time of 1 hour or longer can advance imidization and increase molecular weight more effectively. The upper limit of the reaction time is not particularly limited, and is performed in the range of 10 hours or shorter.

In production of the polyimide resin of the present embodiment, when "A mol" of the tetracarboxylic acid component and "B mol" of the diamine component are reacted, the reaction is preferably in the range of $0.80 \leq A/B \leq 0.99$, and more preferably in the range $0.85 \leq A/B \leq 0.95$. When $A/B \leq 0.99$, the terminal end of the polyimide can be made into a diamine in excess, a polyimide resin having an amino group at a terminal end can be obtained, and a polyimide resin having a molecular weight which satisfies sufficient solvent solubility can be obtained. When $0.80 \leq A/B$, a polyimide resin having a molecular weight that realizes sufficient flexibility can be obtained.

As the ratio A/B approaches 1.0, a polyimide resin having a high molecular weight can be formed. Therefore, when the ratio A/B is adjusted appropriately, a polyimide resin having a target molecular weight can be formed.

<Polyimide Varnish>

In one aspect of the present embodiment, there is provided a polyimide varnish containing at least one polyimide resin selected from the polyimide resin and a modified polyimide resin described later, and an organic solvent. The polyimide resin is as described above. The modified polyimide resin will be described below. The organic solvent is not particularly limited as long as it dissolves the polyimide resin or the modified polyimide resin. One type or a mixture of two or more types of the compounds described above as the reaction solvents used during the production of the polyimide resin is preferably used.

The polyimide varnish of the present embodiment may be a polyimide solution itself in which a polyimide resin or a modified polyimide resin formed by a polymerization method is dissolved in a reaction solvent, or may be diluted by further adding a solvent to the polyimide solution.

Since the polyimide resin or the modified polyimide resin of the present embodiment has excellent solvent solubility, a varnish having a high concentration, which is stable at room temperature, can be prepared. The polyimide varnish of the present embodiment contains preferably from 5 to 40 mass %, and more preferably from 10 to 30 mass %, of the polyimide resin described in detail. A viscosity of the polyimide varnish is preferably from 1 to 200 Pa s and more preferably from 1 to 100 Pa s. The viscosity of the polyimide varnish is a value measured at 25° C. using an E-type viscometer.

Furthermore, the polyimide varnish of the present embodiment may contain various additives, such as inorganic fillers, adhesion promoters, release agents, flame retardants, ultraviolet stabilizers, surfactants, leveling agents, defoaming agents, fluorescent brightening agents, crosslinking agents, polymerization initiators, and photosensitizers, in the range that does not impair required characteristics of a polyimide film.

The method of producing the polyimide varnish is not particularly limited, and a known method can be employed.

[Molded Body]

According to one aspect of the present embodiment, there is provided a molded body formed by molding the polyimide varnish. Specifically, a membrane-shaped, film-shaped, or sheet-shaped molded body can be provided as the molded body.

The molded body is excellent in optical isotropy, flexibility, and chemical resistance.

A method for producing the molded body is not particularly limited, and a well-known method can be used. Examples thereof include a method for coating the polyimide varnish of the present embodiment on a smooth support such as a glass plate, a metal plate, or plastic, and molding into a membrane shape, a film shape, or a sheet shape, and then removing an organic solvent such as a reaction solvent or a dilution solvent contained in the varnish by heating.

Examples of the coating method include a known coating method such as spin coating, slit coating, and blade coating. Among them, the slit coating is preferable from the viewpoint of controlling intermolecular orientation to improve chemical resistance and workability.

As a method for removing the organic solvent contained in the varnish by heating, the preferable method is to evaporate the organic solvent at a temperature of 150° C. or lower to make it tack-free, and then to dry the organic solvent at a temperature equal to or higher than the boiling point of the used organic solvent (although not particularly limited, the temperature is preferably 200 to 500° C.). In addition, drying is preferably carried out under an air atmosphere or a nitrogen atmosphere. The drying may be carried out in either a depressurized atmosphere, an ordinary pressure atmosphere, or a pressurized atmosphere.

A method for peeling the polyimide film formed on the support from the support, for example, is not particularly limited, and examples thereof include a laser lift-off method, a method using a sacrificial layer for peeling (a method for applying the surface of the support with a release agent in advance), and a method for adding a release agent.

A thickness of the membrane-shaped, film-shaped, or sheet-shaped molded body of the present embodiment can be appropriately selected according to the application and the like, and is preferably in the range from 1 to 250 μm, more preferably from 5 to 100 μm, still more preferably from 8 to 80 μm, and even more preferably from 10 to 80

μm. When the thickness is in the range from 1 to 250 μm, practical use as a free-standing film becomes possible.

The thickness of the molded body can be easily controlled by adjusting the solid content concentration and viscosity of the polyimide varnish.

The membrane-shaped, film-shaped, or sheet-shaped molded body in the present embodiment is suitably used as a film for various members such as a color filter, a flexible display, a semiconductor component, and an optical member, and is particularly suitably used as a substrate of an image display device such as a liquid crystal display and an OLED display.

[Modified Polyimide Resin and Photosensitive Resin Composition]

The present embodiment provides a modified polyimide resin including a structure represented by the following general formula (I); and provides a photosensitive resin composition containing at least one polyamide selected from the modified polyimide resin (A) and the polyimide resin of the present embodiment described above, and at least one (B) selected from the group consisting of a photopolymerization initiator, a solvent, and a photopolymerizable compound.

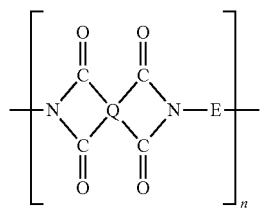

(I)

In General Formula (I), E has at least one group selected from the group consisting of an aliphatic hydrocarbon group, cycloaliphatic hydrocarbon group, aromatic hydrocarbon group, and organosiloxane group, and is a divalent group having from 2 to 39 carbon atoms. Q may contain 60 mol % of the structure represented by General Formula (II) below, and contain a cyclic structure, an acyclic structure, or a tetravalent group having 4 or more and 10 or less carbon atoms with the cyclic structure and the acyclic structure, in addition to the structure represented by General Formula (II). n represents the number of repeating units. A terminal end of General Formula (I) is either a group represented by Formula (III) or Formula (IV) below, or a hydrogen atom, and at least one of the terminal ends is a group represented by Formula (III) or Formula (IV):

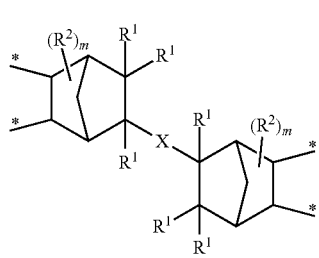

(II)

In General Formula (II), X represents a single bond, and one type selected from the group consisting of a divalent aromatic hydrocarbon group having from 6 to 30 carbon atoms. The divalent aromatic hydrocarbon group represented by X may be substituted with a substituent, and the number of carbon atoms represents the number of carbon atoms forming an aromatic ring. In a case where X is a single bond, a plurality of $R^1$s each independently represent a hydrogen atom, an alkyl group having 1 to 10 carbon atoms, a hydroxyl group, or a nitro group, or two $R^1$ groups bonded to the same carbon atom represent a methylidene group ($=CH_2$). In a case where X is a divalent aromatic hydrocarbon group, a plurality of $R^1$s each independently represent at least one type selected from the group consisting of a hydrogen atom and an alkyl group having from 1 to 10 carbon atoms. A plurality of $R^2$s each independently represent a hydrogen atom or an alkyl group having from 1 to 10 carbon atoms. m represents an integer from 0 to 4. * represents an atomic bond.

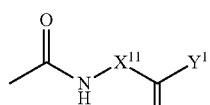

(III)

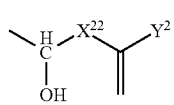

(IV)

In General Formula (III) and (IV), $X^{11}$ and $X^{22}$ are each independently a group having from 2 to 15 carbon atoms and may have at least one group selected from the group consisting of ester bonds and double bonds. $Y^1$ and $Y^2$ are each independently a hydrogen atom or a methyl group.

Specific examples of X, $R^1$, $R^2$, and m in General Formula (II) may include the same ones as those described in detail in the polyimide resin, and preferred ones are also the same. Combinations of the preferred ones are equally preferred.

The modified polyimide resin of the present embodiment is required to contain the modified polyimide resin (A) in which Q in General Formula (I) contains 60 mol % or greater of the structural unit represented by General Formula (II) as described above. When the proportion of the structural unit in which Q is represented by General Formula (II) in General Formula (I) is less than 60 mol %, the solvent solubility of the photosensitive resin composition is poor, which is not preferable.

The proportion of the structural unit represented by General Formula (II) is more preferably 70 mol % or greater, still more preferably 80 mol % or greater, even more preferably 95 mol % or greater, and particularly preferably 100 mol %.

Q other than that of General Formula (II) preferably has at least a cyclic structure, and can contain a structural unit derived from any tetracarboxylic acid as described above with respect to the polyimide resin. Examples of the cyclic structure include tetravalent groups formed by excluding four hydrogen atoms from cyclohexane, cyclopentane, cyclobutane, bicyclopentane, and stereoisomers thereof. Preferred examples are as described above, and examples of the structural unit can include the following structures. In the following formula, a tetravalent group formed by excluding four hydrogen atoms from cyclohexane is preferable.

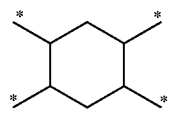

-continued

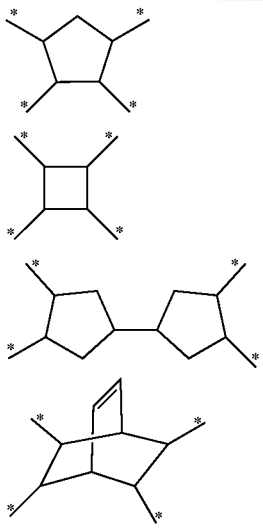

where * indicates an atomic bond.

In General Formula (I), E is a divalent group having from 2 to 39 carbon atoms and has at least one group selected from the group consisting of an aliphatic hydrocarbon group, cycloaliphatic hydrocarbon group, aromatic hydrocarbon group, and organosiloxane group. On a main chain of E, at least one intervening group selected from the group consisting of —O—, —SO$_2$—, —CO—, —CH$_2$—, —C(CH$_3$)$_2$—, —C$_2$H$_4$O—, and —S— may be present.

More specifically, E includes a divalent group formed by removing two hydrogen atoms from a compound such as cyclohexane, dicyclohexylmethane, dimethylcyclohexane, isophorone, norbornane and alkyl substitutes thereof and halogen substitutes thereof; benzene, naphthalene, biphenyl, diphenylmethane, diphenyl ether, diphenylsulfone, benzophenone and alkyl substitutes thereof and halogen substitutes thereof; and organo(poly)siloxanes. E preferably has a cyclic structure, and more preferably has at least one selected from a cycloaliphatic hydrocarbon group and an aromatic ring. More preferably, E has an aromatic ring as an aromatic hydrocarbon group.

The divalent group having from 2 to 39 carbon atoms represented by E is more specifically represented below.

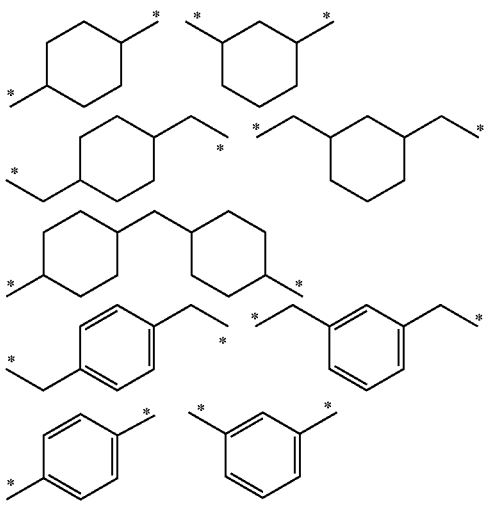

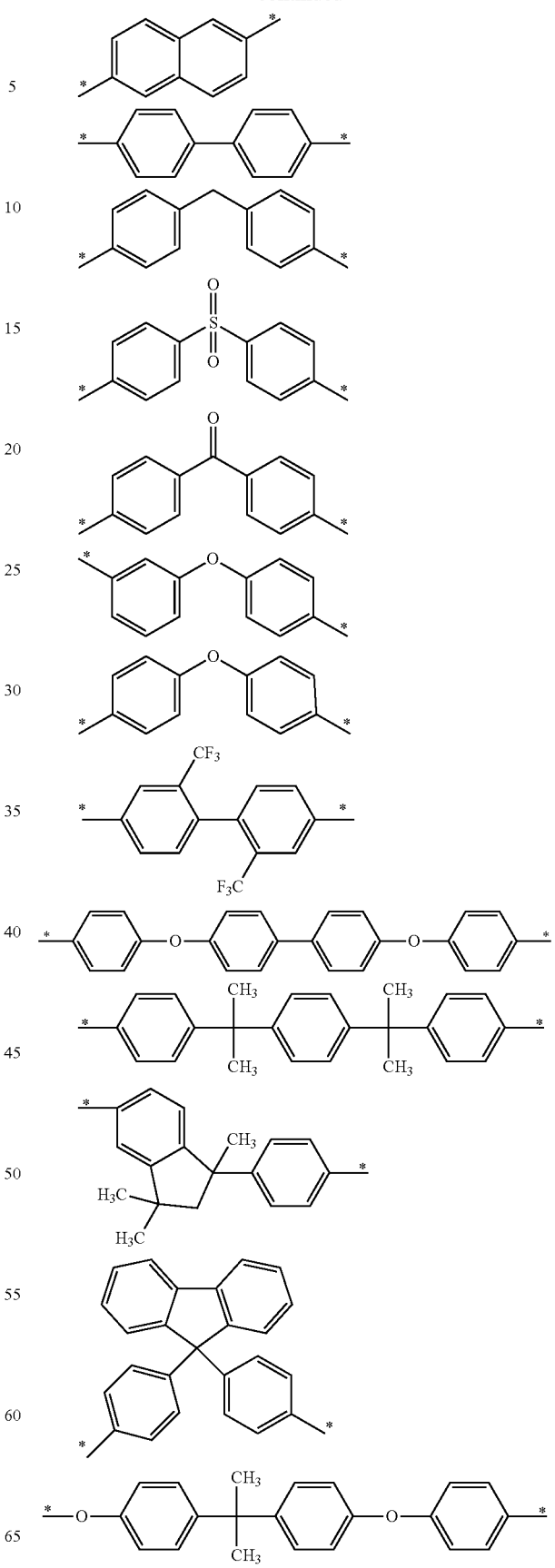

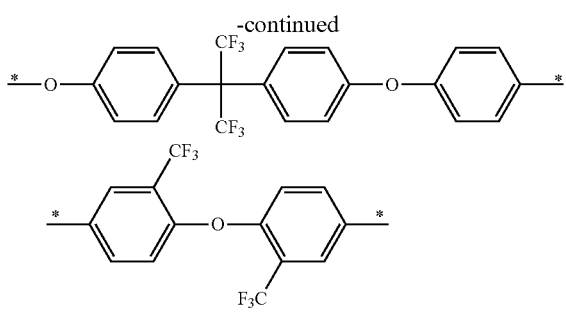

where * indicates an atomic bond.

More specifically, examples of the divalent group having from 2 to 39 carbon atoms represented by E preferably include at least one group (I-a) selected from the group consisting of the following structures.

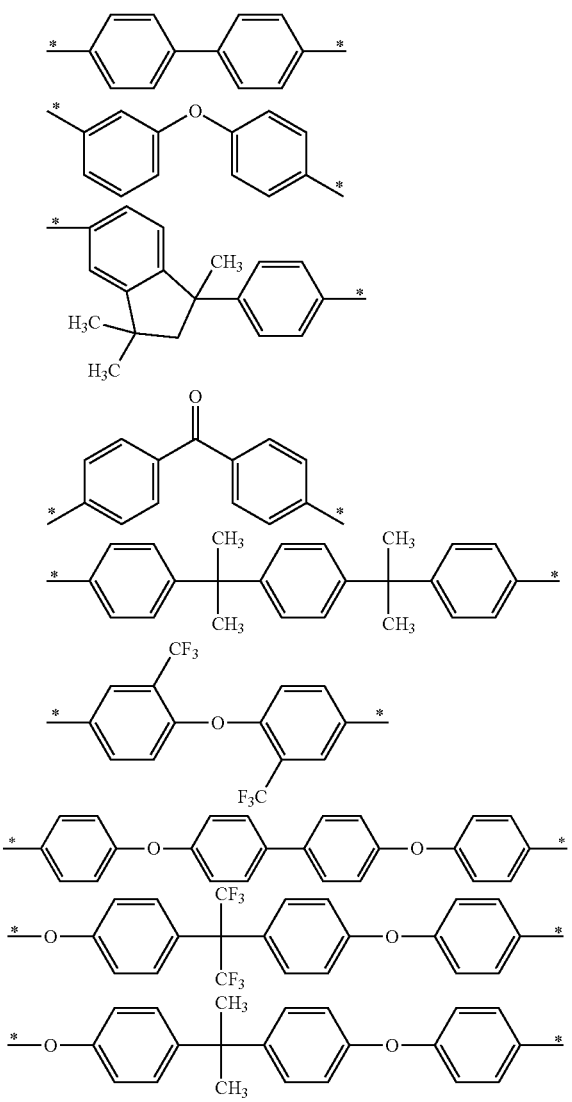

where * indicates an atomic bond.

More preferably, the group corresponding to E exemplified includes at least one group (I-b) selected from the group consisting of the structures shown below.

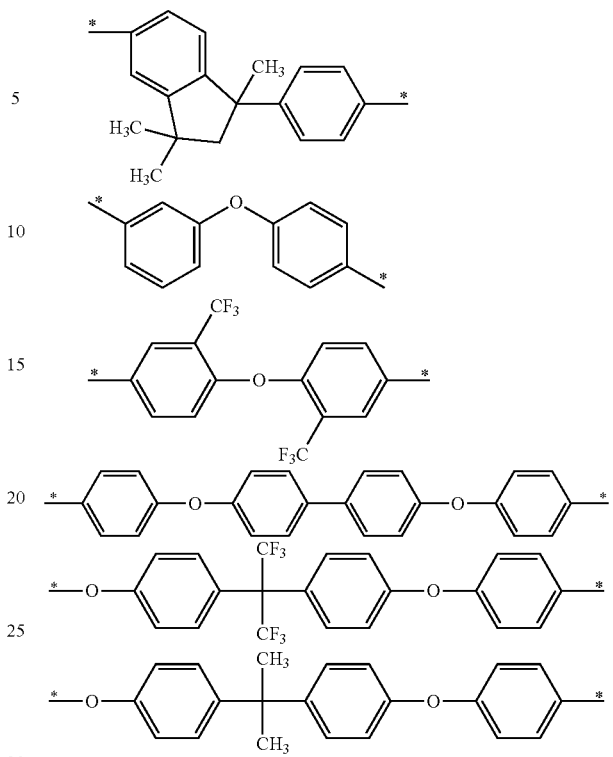

where * indicates an atomic bond.

E in General Formula (I) particularly preferably includes a group represented by Formula (I-c) below.

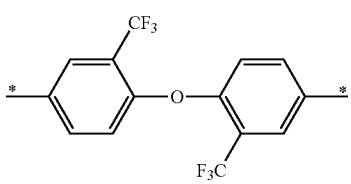

(I-c)

where * indicates an atomic bond.

In the modified polyimide resin contained in the photosensitive resin composition of the present embodiment, a proportion of at least one structural unit selected from the above (I-a), (I-b), and (I-c) as E in General Formula (I) is preferably 60 mol % or greater from the viewpoint of the solvent solubility.

The proportion of at least one structural unit selected from the above (I-a), (I-b), and (I-c) as E in General Formula (I) is more preferably 70 mol % or greater, still more preferably 80 mol % or greater, even more preferably 95 mol % or greater, and particularly preferably 100 mol %. Among them, preferably, the structural units derived from the diamine represented by Formula (I-c) are included in the above proportion.

n indicating the number of repeating units of the structural unit represented by Formula (I) is preferably 5 or greater, more preferably 10 or greater, and still more preferably 15 or greater, and is preferably 250 or less, more preferably 200 or less, and still more preferably 150 or less. When n is 15 or more, a cured film has desired mechanical properties. When n is 250 or less, sufficient solvent solubility can be ensured.

The modified polyimide resin (A) of the present embodiment has either the group represented by General Formula (III) or General Formula (IV), or a hydrogen atom at a terminal end, and at least one of the terminal ends is a group represented by General Formula (III) or General Formula (IV). The modified polyimide resin (A) may have a structure represented by General Formula (III) or General Formula (IV) on one terminal end, or may have a structure represented by General Formula (III) or General Formula (IV) on both terminal ends.

The group represented by $X^{11}$ or $X^{22}$ in General Formula (III) or General Formula (IV) is a group having from 2 to 15 carbon atoms and may have at least one group selected from the group consisting of ester bonds and double bonds. The group represented by $Y^1$ or $Y^2$ is a hydrogen atom or a methyl group.

More specifically, the structure represented by General Formula (III) or General Formula (IV) corresponds to a structure formed by reacting a terminal amine of the polyimide resin with a functional group-containing compound. Examples of the functional group-containing compound include compounds having an isocyanate group or an epoxy group and a (meth)acryl group. Examples of the compound include 2-isocyanatoethyl methacrylate, 2-isocyanatoethyl acrylate, 1,1-bis(acryloyloxymethyl)ethyl isocyanate, glycidyl methacrylate, glycidyl acrylate, and allyl glycidyl ether. The structure represented by General Formula (III) or General Formula (IV) may have a structure formed by reacting the compound and the amine terminal.

The modified polyimide resin (A) preferably has a weight average molecular weight of 70000 or less. When the weight average molecular weight is 70000 or less, the solvent solubility of the resin composition is not adversely affected, and the resin composition is suitable for forming a cured film. The weight average molecular weight is more preferably 60000 or less, still more preferably 50000 or less, even more preferably 45000 or less, even still more preferably 40000 or less, particularly preferably 30000 or less. Since a cured film having desired mechanical properties can be formed, the weight average molecular weight of the modified polyimide resin (A) is preferably 5000 or greater. The weight average molecular weight of the modified polyimide resin (A) is more preferably 10000 or greater, still more preferably 13000 or greater, and even more preferably 15000 or greater. When the weight average molecular weight of the modified polyimide resin (A) is within the range described above, a residual film ratio of the unexposed portion is low, and a resin composition having excellent characteristics in development can be formed. Here, the weight average molecular weight is a weight average molecular weight calculated from absolute molecular weight measurement by a GPC-light scattering method.

<Method for Producing Modified Polyimide Resin (A)>

The modified polyimide resin (A) contained in the photosensitive resin composition of the present embodiment can be formed by a production method including the following steps (1) and (2):

Step (1): a tetracarboxylic acid component and a diamine component are reacted to form a polyimide resin having an amino group in its terminal end.

Step (2): the polyimide resin having an amino group at the terminal end produced in step (1), and the functional group-containing compound (a compound having an isocyanate group or an epoxy group and a (meth)acryl group) are reacted.

The step (1) is the same as the method for producing a polyimide resin described above. The same applies to materials used as raw materials, preferred materials, and reaction conditions.

<Step (2)>

Step (2) is a step of modifying the terminal end of the polyimide resin formed in step (1). Specifically, as described above, the polyimide and the functional group-containing compound described above (a compound having an isocyanate group or epoxy group and a (meth)acryl group) is reacted to produce a modified polyimide resin having a (meth)acryl group at the terminal end.

The functional group-containing compound that modifies the terminal end of the polyimide resin is a compound having an isocyanate group or an epoxy group and a (meth)acryl group. Specific examples include 2-isocyanatoethyl methacrylate, 2-isocyanatoethyl acrylate, 1,1-bis(acryloyloxymethyl)ethyl isocyanate, glycidyl methacrylate, glycidyl acrylate, and allyl glycidyl ether. These functional group-containing compounds may be used alone or in combination of two or more. The functional group-containing compound is preferably used at a ratio from 0.1 to 30 molar ratio with respect to a polyimide resin having an amino group at a terminal end. The reaction temperature in step (2) is preferably in the range from 30 to 100° C., and the reaction time is preferably from 1 to 5 hours.

When the amino group terminal of the polyimide resin is reacted with the isocyanate group or epoxy group of the functional-group-containing compound, the reaction may be carried out as it is or, if necessary, in the presence of a catalyst. Examples of the catalyst include amine compounds such as triethylamine, organic phosphorus compounds such as triphenylphosphine, and the like, and these may be used alone, or a combination of two or more types may be used. A polymerization inhibitor may be used to suppress side reactions during the reaction. Examples of polymerization inhibitors include hydroquinone, hydroquinone monomethylether, and methylhydroquinone, and these may be used alone, or a combination of two or more types may be used.

The content of the polyimide resin in the photosensitive resin composition according to the present embodiment is preferably 30 mass % or greater, more preferably 40 mass % or greater, still more preferably 50 mass % or greater, even more preferably 60 mass % or greater, and even still more preferably 70 mass % or greater, and preferably 90 mass % or less and more preferably 80 mass % or less based on 100 mass % of the total solid content of the photosensitive resin composition.

Here, in the present embodiment, the total solid content of the photosensitive resin composition is a component remaining as a solid content when the photosensitive resin composition is cured, and for example, a component volatilized by heating such as a solvent is excluded. On the other hand, even in the case of the liquid component, the component incorporated into the resin film when heated and cured is included in the total solid content.

In addition, the content of the modified polyimide resin (A) in the photosensitive resin composition according to the present embodiment is preferably 50 parts by mass or greater, more preferably 70 parts by mass or greater, still more preferably 80 parts by mass or greater, even more preferably 90 parts by mass or greater, and even still more preferably 100 parts by mass, and even still more preferably 100 parts by mass or less when the content of the polyimide resin contained in the photosensitive resin composition is 100 parts by mass.

The modified polyimide resin (A) included in the photosensitive resin composition of the present embodiment preferably has a light transmittance at any wavelength from 200 to 400 nm of 50% or greater, more preferably 55% or greater, still more preferably 60% or greater, even more preferably 70% or greater, even still more preferably 80% or greater, and even still more preferably 90% or greater. In addition, the modified polyimide resin (A) included in the photosensitive resin composition of the present embodiment preferably has a light transmittance at a wavelength 365 nm of 50% or greater, more preferably 55% or greater, still more preferably 60% or greater, even more preferably 70% or greater, even still more preferably 80% or greater, and even still more preferably 90% or greater. In the present embodiment, the light transmittance of the modified polyimide resin (A) is the light transmittance of a solution having a solid content concentration of 3 mass % of the modified polyimide resin (A).

The modified polyimide resin (A) included in the photosensitive resin composition of the present embodiment has high light transmittance at the wavelength described above, and has excellent solvent solubility. As a result, the photopolymerization initiator that can be included in the composition functions effectively, and thus the cured film can be efficiently produced. In addition, the modified polyimide resin (A) having a specific structure and a specific terminal structure and having a specific molecular weight is used, and thus, when a cured film is formed from the composition described below, the residual film ratio of the unexposed portion is low, excellent characteristics in development are achieved, and the occurrence of cracks and the like can be effectively suppressed.

The photosensitive resin composition of the present embodiment contains at least one polyimide resin selected from the modified polyimide resin (A) and the polyimide resin of the present embodiment described above, and at least one (B) selected from the group consisting of a photopolymerization initiator, a solvent, and a photopolymerizable compound. The photosensitive resin composition in the present embodiment preferably further contains a sensitizer.

Examples of the solvent include N-methyl-2-pyrrolidone, N-acetyl-2-pyrrolidone, N-benzyl-2-pyrrolidone, N,N-dimethylformamide, N,N-dimethylacetamide, dimethyl sulfoxide, hexamethylphosphortriamide, N-acetyl-ε-caprolactam, dimethylimidazolidinone, diethylene glycol dimethyl ether, triethylene glycol dimethyl ether, and γ-butyrolactone. These solvents may be used alone or in combination of two or more.

The use of an appropriate solvent facilitates use of the photosensitive resin composition of the present embodiment in a solution (varnish) state, and making it convenient for film formation.

As the photopolymerizable compound, a polyfunctional radical polymerizable monomer, for example, a bifunctional or higher (meth)acrylic monomer can be used.

Examples of (meth)acrylic monomer includes tricyclodecanedimethanol diacrylate, tricyclodecanedimethanol dimethacrylate, polypropylene glycol diacrylate, trimethylolpropane triacrylate, trimethylolpropane trimethacrylate, pentaerythritol tetraacrylate, pentaerythritol triacrylate, tris-(2-acryloxyethyl)isocyanurate, ditrimethylolpropane tetraacrylate, and dipentaerythritol hexaacrylate. These photopolymerizable compounds may be used alone or in combination of two or more.

The flexibility and the like of the photosensitive resin composition can be controlled by a structure of the photopolymerizable compound to be blended. The photopolymerizable compound is preferably blended at a proportion from 5 to 500 parts by mass with respect to a solid content in the solution containing a modified polyimide resin having a (meth)acryl group at the terminal end. Further, the content of the photopolymerizable compound in the photosensitive resin composition according to the present embodiment is preferably 5 parts by mass or greater and 500 parts by mass or less when the amount of the polyimide resin contained in the photosensitive resin composition is 100 parts by mass.

The photopolymerization initiator is not particularly limited, and a known photopolymerization initiator can be used. Examples thereof include 2,2-dimethoxy-1,2-diphenylethan-1-one, 1-hydroxycyclohexylphenyl ketone, 2-hydroxy-2-methyl-1-phenyl-propane-1-one, 1-[4-(2-hydroxyethoxy)-phenyl]-2-hydroxy-2-methyl-1-propan-1-one, 2-hydroxy-1-{4-[4-(2-hydroxy-2-methyl-propionyl)-benzyl] phenyl}-2-methyl-propan-1-one, 2-methyl-1-(4-methylthiophenyl)-2-morpholinopropane-1-one, 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone, 2,4,6-trimethylbenzoyl-diphenylphosphine oxide and bis(2,4,6-trimethylbenzoyl)phenylphosphine oxide. The photopolymerization initiator may be used alone or in combination of two or more.

The photopolymerization initiator is preferably mixed at a proportion from 0.1 to 10 parts by mass with respect to a solid content in a solution containing a modified polyimide resin (A) having a (meth)acryl group at a terminal end. Further, the content of the photopolymerization initiator in the photosensitive resin composition according to the present embodiment is preferably 0.1 parts by mass or greater and 10 parts by mass or less when the amount of the polyimide resin contained in the photosensitive resin composition is 100 parts by mass.

The sensitizer is not particularly limited, and a known sensitizer can be used. Examples include an amino group-containing sensitizer, and preferably a compound having an amino group and a phenyl group in the same molecule. More specifically, examples thereof include benzophenone-based compounds such as 4,4'-dimethylaminobenzophenone, 4,4'-diethylaminobenzophenone, 2-aminobenzophenone, 4-aminobenzophenone, 4,4'-diaminobenzophenone, 3,3'-diaminobenzophenone, 3,4-diaminobenzophenone; p-dialkylaminophenyl group-containing compounds such as 2-(p-dimethylaminophenyl)benzoxazole, 2-(p-diethylaminophenyl)benzoxazole, 2-(p-dimethylaminophenyl)benzo[4,5]benzoxazole, 2-(p-dimethylaminophenyl)benzo[6,7]benzoxazole, 2,5-bis(p-diethylaminophenyl)-1,3,4-oxadiazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole, 2,5-bis(p-diethylaminophenyl)-1,3,4-thiadiazole, (p-dimethylaminophenyl)pyridine, (p-diethylaminophenyl)pyridine, (p-dimethylaminophenyl)quinoline, (p-diethylaminophenyl)quinoline, (p-dimethylaminophenyl)pyrimidine, and (p-diethylaminophenyl)pyrimidine. These sensitizers may be used alone or in combination of two or more.

The sensitizer is preferably mixed at a proportion from 0.001 to 10 parts by mass with respect to the solid content in the solution containing the modified polyimide resin (A) having a (meth)acryl group at the terminal end. Further, the content of the sensitizer in the photosensitive resin composition according to the present embodiment is preferably 0.001 parts by mass or greater and 10 parts by mass or less when the amount of the polyimide resin contained in the photosensitive resin composition is 100 parts by mass.

The photosensitive resin composition of the present embodiment is not particularly limited, but can be prepared as follows.

At least one (B) selected from the group consisting of a solvent, a photopolymerization initiator, and a photopolymerizable compound is mixed with at least one polyimide resin selected from the polyimide resin (A) having a structure represented by General Formula (I) and having a terminal structure represented by General Formula (III) or (IV) and the polyimide resin of the present embodiment described above to prepare a photosensitive resin composition. If necessary, a sensitizer may be mixed as described above.

The photosensitive resin composition of the present embodiment is particularly preferably used for forming an insulating film.

[Resin Film]

The photosensitive resin composition according to the present embodiment can be used, for example, to form a resin film such as a photoresist used in manufacturing an electronic device or a permanent film constituting an electronic device (cured film). That is, the resin film according to the present embodiment is formed of a photosensitive resin composition or a cured product of the photosensitive resin composition.

The photoresist is formed of, for example, a resin film formed by coating the photosensitive resin composition according to the present embodiment on a substrate and removing a solvent as necessary.

The permanent film is formed of a cured film formed by exposing and developing the resin film, patterning the resin film into a desired shape, and then curing the resin film by a heat treatment or the like.

The permanent film can be suitably used as, for example, an insulating film such as a surface protective film or an interlayer insulating film.

In the case of formation of the resin film in the present embodiment, a solution containing the photosensitive resin composition is applied onto a substrate.

The method of application on the substrate is not particularly limited, and specific examples include ink jet methods, spin coating methods, casting methods, microgravure methods, gravure coating methods, bar coating methods, roll coating methods, wire bar coating methods, dip coating methods, spray coating methods, screen printing methods, flexographic printing methods, and die coating methods.

When the solution is coated on the substrate, the solid content concentration of the photosensitive resin composition of the present embodiment is preferably adjusted so as to be in a range from 5 to 50 mass %. The solvent used during application is preferably an aprotic polar solvent from the viewpoint of solubility. Specifically, suitable examples include N-methyl-2-pyrrolidone, N-acetyl-2-pyrrolidone, N-benzyl-2-pyrrolidone, N,N-dimethylformamide, N,N-dimethylacetamide, dimethyl sulfoxide, hexamethylphosphortriamide, N-acetyl-ε-caprolactam, dimethylimidazolidinone, diethylene glycol dimethyl ether, triethylene glycol dimethyl ether, and γ-butyrolactone. These solvents may be used alone or in combination of two or more. To further improve the applicability, solvents such as toluene, xylene, diethyl ketone, methoxybenzene, cyclopentanone, and the like may be mixed in a range that does not adversely affect the solubility of the polymer.

Examples of the substrate include glass, silicon wafer, metal foil, and plastic film. Among the substrates above, a silicon wafer and copper foil are preferably used.

The photosensitive resin composition of the present embodiment applied on the substrate is irradiated with light (typically using ultraviolet light) via a photomask with a predetermined pattern. After irradiation, an unexposed portion can be dissolved and removed by a developer to obtain a desired relief pattern.

A dose of ultraviolet radiation is preferably from 500 to 8000 $mJ/cm^2$.

In the method for forming a resin pattern using the photosensitive resin composition of the present embodiment, an organic solvent is preferably used as the developer. The developer is not particularly limited as long as it dissolves the photosensitive resin composition according to the present embodiment. Specifically, suitable examples include N-methyl-2-pyrrolidone, N-acetyl-2-pyrrolidone, N-benzyl-2-pyrrolidone, N,N-dimethylformamide, N,N-dimethylacetamide, dimethyl sulfoxide, hexamethylphosphortriamide, N-acetyl-ε-caprolactam, dimethylimidazolidinone, diethylene glycol dimethyl ether, triethylene glycol dimethyl ether, and γ-butyrolactone. These developers may be used alone or in combination of two or more.

The relief pattern formed by the development is then washed with a rinse solution to remove the developing solvent. Suitable examples of the rinse solution include methanol, ethanol, isopropyl alcohol, and water, which are miscible with the developer.

The relief pattern obtained by the process described above can be heated at a temperature selected from a range from 80 to 250° C., the solvent is dried, and a cured film formed by curing the photosensitive resin composition of the present embodiment can be obtained. According to the present embodiment, since a resin composition is used which has excellent developability, that is, an exposed portion is sufficiently cured, and an unexposed portion is sufficiently removed due to high solvent solubility of the modified polyimide resin contained in the photosensitive resin composition, a relief pattern can be formed with high resolution.

In the cured film formed by curing the photosensitive resin composition according to the present embodiment, specifically, a residual film ratio of an unexposed portion after exposure to light of a high-pressure mercury lamp excluding light having a wavelength of less than 365 nm under a condition of an exposure amount (integrated irradiation amount) being from 1500 to 2500 $mJ/cm^2$ (calculated from the illuminance of 365 nm) is preferably 40% or less, more preferably 30% or less, and still more preferably 10% or less. The light source for exposure is not particularly limited, but, for example, a high-pressure mercury lamp can be used, and the film is exposed at the dose described above at 365 nm.

"Unexposed portion residual film ratio" herein refers to a value calculated from the following definitions. Details of the measurement method are described in the Examples.

Unexposed portion residual film ratio (%)=[mass of unexposed portion after development/mass of unexposed portion before development]×100

In the cured film formed by curing the photosensitive resin composition according to the present embodiment, the exposed portion residual film ratio is preferably 70% or greater, more preferably 80% or greater, and still more preferably 85% or greater.

Herein, the "exposed portion residual film ratio" is a value calculated from the following definitions. Details of the measurement method are detailed in the Examples.

Exposed portion residual film ratio (%)=[mass of exposed portion after development/mass of exposed portion prior to development]×100

A thickness of the cured film obtained by the present embodiment is preferably from 10 to 85 μm. When the film thickness is within the range described above, it can be used as an excellent insulating film. When the film thickness is thicker (i.e., the amount of the photosensitive resin composition applied to the substrate increases), the solvent solubility of the polyimide resin often becomes particularly problematic. However, according to the present embodiment, the use of the polyimide resin (modified polyimide resin) having a specific structure and a specific terminal structure and having a specific molecular weight range can achieve both excellent solubility solvent properties and transparency in such a case.

Therefore, the cured film of the present embodiment can be suitably used in, for example, an insulating film application where the application of high voltage is assumed. The cured film formed from the photosensitive resin composition of the present embodiment including the modified polyimide resin (A) having a specific structure and a specific terminal structure and having a specific molecular weight can effectively suppress the occurrence of cracks and the like, and has excellent physical properties.

[Applications]

The photosensitive resin composition and the cured film of the present embodiment can be used in various applications. For example, the photosensitive resin composition and the cured film can be suitably used in a surface protective film and an interlayer insulating film of a semiconductor element for an electronic device, and used in a wiring protection insulating film for a circuit board, and in particular, it can be suitably used for the above-mentioned applications with high density and high integration.

The surface protective film refers to an insulating film formed on a surface of an electronic component or an electronic device or a surface of a wiring of a wiring board to protect the surface, and a type of the surface protective film is not particularly limited. Examples of such a surface protective film include a passivation film or a buffer coat layer provided on a semiconductor element, and a cover coat provided on a flexible substrate.

The interlayer insulating film refers to an insulating film provided in a multilayer structure, and the type thereof is not particularly limited. Examples of the interlayer film include an interlayer film used in semiconductor device applications such as an interlayer insulating film constituting a multilayer wiring structure of a semiconductor element, and a build-up layer or a core layer constituting a wiring board. In addition, examples of the interlayer film include those used in display device applications such as a planarization film covering a thin film transistor in a display device, a liquid crystal alignment film, a protrusion provided on a color filter substrate of a liquid crystal display device, or a partition wall for forming a cathode of an organic EL element.

[Electronic Device]

The electronic device according to the present embodiment includes a resin film according to the present embodiment.

The electronic device according to the present embodiment is not particularly limited as long as the electronic device includes a resin film formed of a photosensitive resin composition according to the present embodiment, and examples include a display device having the resin film according to the present embodiment as a flattening film or a microlens; a semiconductor device including a multilayer wiring structure using the resin film according to the present embodiment as an interlayer insulating film; a semiconductor device using the resin film according to the present embodiment as a surface protective film of a semiconductor element or a wiring substrate; a semiconductor device using the resin film according to the present embodiment as a build-up layer or a core layer constituting a wiring board. Among them, a semiconductor device is preferable as the electronic device according to the present embodiment.

The electronic device according to the present embodiment can be manufactured on the basis of known information except for using the resin film according to the present embodiment.

Since the electronic device according to the present embodiment includes the resin film excellent in developability, the electronic device includes a good patterning shape, is less likely to cause dielectric breakdown or the like, and is excellent in reliability.

The present embodiment can provide a polyimide resin that does not require a heating step, has high transparency, and is excellent in solvent solubility, and thus has excellent developability, a photosensitive resin composition containing the polyimide resin, a resin film thereof, and an electronic device containing the resin film. Because the resin composition has a low curing shrinkage, occurrence of cracking or the like in the formed cured film can be effectively suppressed.

EXAMPLES

The present invention will be described in further detail hereinafter using examples and comparative examples, but the present invention is not limited to the following examples.

The evaluation methods employed in the examples and comparative examples are as follows.

(1) Weight Average Molecular Weight

The weight average molecular weight (Mw) was determined by GPC analysis. The equipment used for the analysis and the analysis conditions were as follows.

Equipment: Viscotek TDAmax (available from Malvern Panalytical Ltd.)

Column: T6000M×2 (available from Malvern Panalytical Ltd.)

Eluent: 20 mM Lithium bromide added dimethylformamide

Flow rate: 1.0 ml/min

Column temperature: 40° C.

Detector: RI (refractive index detector), RALS (light scatter detector), LALS (light scatter detector)

(2) Film Reduction

The varnish prepared in each of Synthesis Examples 1 to 3 described below was applied to a silicon wafer using a spin coater, and then heated for 60 minutes at 100° C. to remove the solvent. The mass of the varnish at this point (when the solvent was removed under the conditions described above) was defined as the mass before immersion. After the coating was immersed in the developer of γ-butyrolactone for 2 minutes, the coating was washed using methanol as a rinse solution, and the solvent was removed under air flow until the mass did not change any more. The mass of the film remaining on the silicon wafer after removal of the solvent was defined as the mass after immersion, and the film reduction was determined by the following formula. The higher the value, the better the solubility.

Film reduction (%)=[(mass before immersion−mass after immersion)/mass before immersion]×100

(3) Residual Film Ratio (%) of Unexposed Portion

A varnish including a photosensitive resin composition including polyimide resin was prepared in the examples and comparative examples described below. The varnish prepared in each of the examples and comparative examples was applied to a silicon wafer using a spin coater, and then heated for 60 minutes at 100° C. to remove the solvent. The mass of the varnish at this point (when the solvent was removed under the conditions described above) was defined as the mass of the unexposed portion before development. After the coating was immersed in the developer of γ-butyrolactone for 5 minutes, the coating was washed using methanol as a rinse solution, and the solvent was removed under air flow until the mass did not change any more. The mass of the film remaining on the silicon wafer after removal of the solvent was defined as the mass of the unexposed portion after development, and the unexposed portion residual film ratio was determined by the following formula.

Unexposed portion residual film ratio (%)=[mass of unexposed portion after development/mass of unexposed portion before development]×100

(4) Residual Film Ratio (%) of Exposed Portion

A varnish including a photosensitive resin composition including polyimide resin was prepared in the examples and comparative examples described below. The varnish prepared in each of the examples and comparative examples was applied to a silicon wafer using a spin coater, and then heated for 60 minutes at 100° C. to remove the solvent. The mass of the varnish at this point (when the solvent was removed under the conditions described above) was defined as the mass of the exposed portion before development. After the coating was irradiated with UV and immersed in the developer of γ-butyrolactone for 5 minutes, the coating was washed using methanol as a rinse solution, and the solvent was removed under the air flow until the mass did not change any more. The mass of the film remaining on the silicon wafer after removal of the solvent was defined as the mass of the exposed portion after development, and the exposed portion residual film ratio was determined by the following formula.

Exposed portion residual film ratio (%)=[mass of exposed portion after development/mass of exposed portion before development]×100

The equipment and conditions used during the development in the above (3) and (4) above were as follows.

UV irradiation equipment: ECS-1511 U (available from Eye Graphics Co., Ltd.)
Illuminance: 670 to 700 mW/cm$^2$
Integrated irradiation amount: 2,400 mJ/cm$^2$
Developer: γ-Butyrolactone
Development Time: 5 minutes
Rinse solution: methanol
Silicon wafer: 4 inch silicon wafer (available from Advantec Co., Ltd.)

(5) Light Transmittance

The modified polyimide resins formed in synthesis examples were dissolved in γ-butyrolactone to obtain a polyimide resin solution having a solid content concentration of 3 mass %. Next, the light transmittance of the polyimide resin solution at a wavelength of 365 nm was measured using a spectrophotometer "product name: U3900H" available from Hitachi, Ltd. and a cell having an optical path length of 10 mm.

Example 1

Into a 500 ml five-necked flask equipped with a nitrogen introducing tube, a stirrer, a thermometer, and a condenser, 38.7103 g (0.115 mol) of 4,4'-oxybis[3-(trifluoromethyl)benzenamine] (hereinafter, refer to as 6FODA), 44.6270 g (0.109 mol) of 5,5'-(1,4-phenylene) bis(hexahydro-4,7-methanoisobenzofuran-1,3-dione) (hereinafter, refer to as BzDA) represented by the following formula, and 102.15 g of γ-butyrolactone (hereinafter, refer to as GBL) were placed under nitrogen, and heated to 90° C. with stirring. 1.106 g (0.011 mol) of triethylamine (hereinafter, referred to as TEA) was added thereto, and the mixture was reacted at 190° C. for 5 hours and then diluted with 82.87 g of GBL and 249.6 g of a polyimide varnish having a solid content concentration of 30 mass % was obtained. As a result of measurement by GPC, the weight average molecular weight of the polyimide formed in this synthesis example was 20113, and the film reduction after immersion for 2 minutes in GBL was 83%. The results are shown in Table 1.

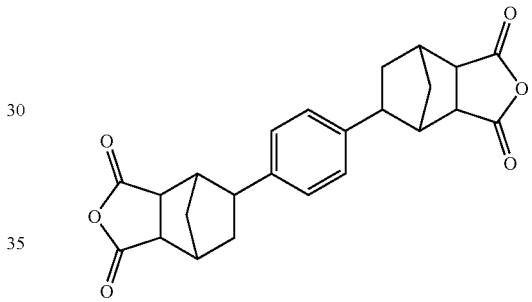

Comparative Example 1

Into a 500 ml five-necked flask equipped with a nitrogen introducing tube, a stirrer, a thermometer, and a condenser, 117.7875 g (0.350 mol) of 6FODA, 74.5592 g (0.333 mol) of 1,2,4,5-cyclohexanetetracarboxylic dianhydride (HPMDA), and 235.11 g of GBL were placed under nitrogen, and heated to 90° C. with stirring. 1.690 g (0.017 mol) of TEA was added thereto, and the mixture was reacted at 190° C. for 5 hours and then diluted with 184.99 g of GBL and 585.1 g of a polyimide varnish having a solid content concentration of 30 mass % was obtained. As a result of measurement by GPC, the weight average molecular weight of the polyimide formed in this synthesis example was 23077, and the film reduction after immersion for 2 minutes in GBL was 40%. The results are shown in Table 1.

Comparative Example 2

Into a 500 ml five-necked flask equipped with a nitrogen inlet tube, a stirrer, a thermometer, and a condenser, 90.401 g (0.26 mol) of 1,4-bis[2-(4-aminophenyl)-2 propyl]benzene (hereinafter, refer to as BiS-AP), 29.959 g (0.11 mol) of 1-(4-aminophenyl)-2,3-dihydro-1,3,3-trimethyl-1H-indene-5-amine (hereinafter, refer to as TMDA), 82.943 g (0.37 mol) of HPMDA, and 249.0 g of GBL were placed under nitrogen, and heated to 90° C. with stirring. 18.72 g (0.19 mol) of TEA and 0.083 g (0.74 mmol) of triethylenediamine (hereinafter, referred to as TEDA) were added thereto, and the mixture was reacted at 190° C. for 5 hours, and then diluted with 512.3 g of DMAc and 952 g of polyimide varnish having a solid content concentration of 20 mass % was obtained. As a result of measurement by GPC, the weight average molecular weight of the polyimide obtained in this synthesis example was 75600. It was confirmed that the state of the membrane after immersion for 2 minutes in GBL was almost the same, and the solubility was poor. The results are shown in Table 1.

Comparative Example 3

In the same manner as in Comparative Example 2, except that the Bis-AP amount was changed to 76.4579 g (0.221 mol), the HPMDA amount was changed to 94.1895 g (0.420 mol), the TEA amount was changed to 2.129 g (0.022 mol), the TEDA amount was changed to 0.000 g (0.00 mmol), and the DMAc amount was changed to 666.09 g, and 90.8831 g (0.221 mol) of 2,2-bis[4-(4-aminophenoxy) phenyl] propane (hereinafter, referred to as BAPP) was used instead of TMDA, 1207 g of polyimide varnish having a 20 mass % of solid content concentration was obtained. As a result of measurement by GPC, the weight average molecular weight of the polyimide formed in this comparative example was 25082. The film reduction after immersion for 2 minutes in GBL was 15%. The results are shown in Table 1.

Comparative Example 4

In the same manner as in Example 1 except that 6FODA amount was used in an amount of 41.0665 g (0.122 mol), CpODA as an acid dianhydride was used in an amount of 45.8347 g (0.116 mol), the TEA amount was changed to 0.586 g (0.006 mol), the GBL amount was changed to 106.24 g, and the GBL amount for dilution was changed to 86.55 g, 261 g of a polyimide varnish having a solid content concentration of 30 mass % was obtained. As a result of measurement by GPC, the weight average molecular weight of the polyimide formed in this synthesis example was 28408, and the film reduction after immersion for 2 minutes in GBL was 9%. The results are shown in Table 1.

TABLE 1

|  |  | Polyimide resin (terminal unmodified) | | | | |
|---|---|---|---|---|---|---|
|  |  | Example | Comparative Example | | | |
|  | Unit | 1 | 1 | 2 | 3 | 4 |
| Mw |  | 20113 | 23077 | 75600 | 25082 | 28408 |
| Film reduction | % | 83 | 40 | —* | 15 | 9 |

*Verified that the membrane state was almost the same, and the solubility was poor.

Example 2

Into a 500 mL four-necked flask equipped with a stirrer, a thermometer, and a condenser, 100.13 g of the polyimide varnish obtained in Example 1 and 3.00 g of 2-isocyanato-ethyl acrylate (Karenz AOI available from Showa Denko K.K.) were placed, and the mixture was reacted at 50° C. for 5 hours. Thereafter, the reaction liquid was added dropwise into water, and the polyimide was deposited, dried overnight at 70° C., and a modified polyimide resin was obtained. The light transmittance of the obtained modified polyimide resin at a wavelength of 365 nm was 93.1%. 4.6 g of this modified polyimide resin was dissolved in 7.0 g of GBL, and 1.16 g of Viscoat 802 (available from Osaka Organic Chemical Industry Co., Ltd., tri-PE-A), 0.069 g of 1-hydroxycyclo-hexylphenyl ketone (available from BASF, IRGACURE (Omnirad) 184), and 0.162 g of bis(2,4,6-trimethylbenzoyl) phenylphosphine oxide (available from BASF, IRGACURE (Omnirad) 819) were added and stirred until dissolved to form a photosensitive resin composition (photosensitive resin varnish). The photosensitive resin composition was applied to a silicon wafer and dried at 100° C. for 60 minutes. The coating was immersed in GBL for 5 minutes, rinsed with methanol, and the solvent was removed until there was no change in mass under air flow, and the unexposed portion residual film ratio was calculated. The unexposed portion residual film ratio at this time was 0%. Furthermore, after the photosensitive resin composition was applied onto a silicon wafer and dried for 60 minutes at 100° C., Eye Mini Grantage (ECS-1511U) available from Eye Graphics Co., Ltd. was used, a high-pressure mercury lamp (the light of a high-pressure mercury lamp excluding light having a wavelength of less than 365 nm) is used as a light source, the mixture was exposed under the conditions of the exposure amount (integrated irradiation amount) of 1500 to 2500 mJ/cm$^2$ at an exposure wavelength of 365 nm (calculated from the illuminance of 365 nm) to form a cured film, then the cured film was immersed for 5 minutes in a GBL, and rinsed with methanol, the solvent was removed under air flow until there was no mass change, and the exposed portion residual film ratio was calculated. The exposed portion residual film ratio at this time was 100%. The results are shown in Table 2.

Comparative Examples 5 to 7

A photosensitive resin composition was prepared in the same manner as in Example 2 with the exception that the formulations shown in the following table were used, and the properties thereof were evaluated. The results are shown in Table 2.

TABLE 2

|  |  | Example | Comparative Example | | |
|---|---|---|---|---|---|
|  | Unit | 2 | 5 | 6 | 7 |
| Raw material polyimide (terminal unmodified) |  | Example 1 | Comparative Example 2 | Comparative Example 3 | Comparative Example 4 |
| Photosensitive group introduction (terminal modification) | | | | | |
| Polyimide | g | 100.13 | 180 | 181.27 | 202.05 |
| AOI | g | 3.00 | 1.37 | 3.41 | 3.04 |
| BEI*[1] | g | | | | |
| MEHQ | g | | 0.01 | | |

TABLE 2-continued

| | Unit | Example 2 | Comparative Example 5 | Comparative Example 6 | Comparative Example 7 |
|---|---|---|---|---|---|
| Cured Film Evaluation | | | | | |
| Terminal-modified polyimide resin (A) | g | 4.6 | 3.0 | 1.5 | 1.3 |
| GBL | g | 7.0 | 10.0 | 2.8 | 3.1 |
| TMP-TA | g | | 0.75 | | |
| tri-PE-A*[2] | | 1.16 | | 0.38 | 0.33 |
| diPE-HA*[3] | g | | | | |
| IRGACURE184 | g | 0.069 | 0.045 | 0.022 | 0.020 |
| IRGACURE819 | g | 0.162 | 0.105 | 0.053 | 0.046 |
| Unexposed Portion Residual Film Ratio | % | 0 | 52 | 56 | 71 |
| Exposed Portion Residual Film Ratio | % | 100 | 100 | 96 | 100 |

*[1]1,1-bis(acryloyloxymethyl)ethyl isocyanate (Karenz BEI, available from Showa Denko K.K.)
*[2]Mixture of tripentaerythritol acrylate, mono and dipentaerythritol acrylate, polypentaerythritol acrylate (available from Osaka Organic Chemical Industry Co., Ltd., tri-PE-A)
*[3]Dipentaerythritol hexaacrylate Compared to comparative examples, it was clear that the cured film containing the photosensitive resin composition according to the present embodiment had excellent developing properties. Note that, although there is a difference in the crosslinking agent due to the formulation, the present examples and comparative examples measure the residual film ratio by exposing the entire surface, and thus the difference does not affect the result.

The photosensitive resin composition according to the present embodiment contains a polyimide resin having excellent solvent solubility, and thus has an advantage that a patterning treatment can be performed in a short time.

The invention claimed is:

1. A modified polyimide resin comprising:
a structure represented by General Formula (I),

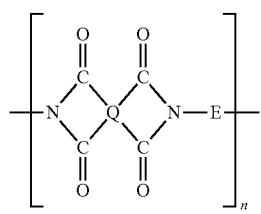
(I)

wherein, E comprises a group represented from a following formula (I-c); Q may comprise 60 mol % or greater of the structure represented by General Formula (II), and may comprise a tetravalent group having 4 or more and 10 or less carbon atoms with a cyclic structure, an acyclic structure, or a cyclic structure and a acyclic structure, in addition to the structure represented by General Formula (II); n represents the number of repeating units; a terminal end in the general formula (I) is either a group represented by Formula (III) or Formula (IV), or a hydrogen atom, and at least one of the terminal ends is a group represented by Formula (III) or Formula (IV); and

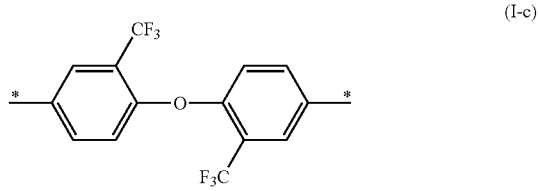
(I-c)

wherein * represents an atomic bond,

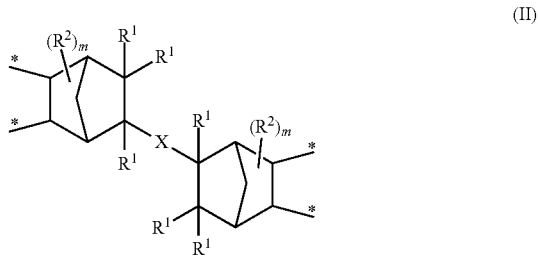
(II)

wherein, X is selected from the group consisting of a divalent aromatic hydrocarbon group having from 6 to 30 carbon atoms; the divalent aromatic hydrocarbon group represented by X may be substituted with a substituent, and the number of carbon atoms represents the number of carbon atoms forming an aromatic ring, a plurality of $R^1$s each independently represent at least one type selected from the group consisting of a hydrogen atom and an alkyl group having from 1 to 10 carbon atoms; a plurality of $R^2$s each independently represent a hydrogen atom or an alkyl group having from 1 to 10 carbon atoms; and m represents an integer from 0 to 4; and

* represents an atomic bond; and

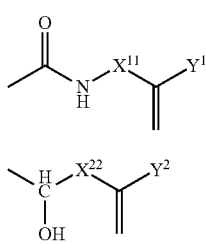

(III)

(IV)

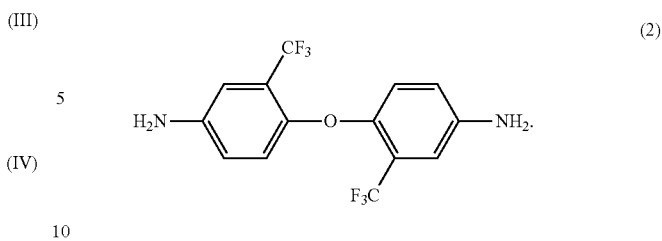

(2)

wherein, $X^{11}$ and $X^{22}$ are each independently a group having from 2 to 15 carbon atoms and may have at least one group selected from the group consisting of an ester bond and a double bond; and $Y^1$ and $Y^2$ are each independently a hydrogen atom or a methyl group.

2. The modified polyimide resin according to claim 1, wherein a weight average molecular weight of the modified polyimide resin is 70000 or less.

3. The modified polyimide resin according to claim 1, wherein the weight average molecular weight of the modified polyimide resin is 5000 or greater.

4. The modified polyimide resin according to claim 1, wherein a light transmittance at a wavelength from 200 to 400 nm of the modified polyimide resin is 50% or greater.

5. A polyimide resin for a photosensitive resin composition, comprising:
   a structural unit A derived from a tetracarboxylic dianhydride; and
   a structural unit B derived from a diamine compound,
   wherein the structural unit A comprises a structural unit derived from a compound represented by Formula (1) in a proportion of 60 mol % or greater, and the structural unit B comprises a structural unit derived from a compound represented by Formula (2),

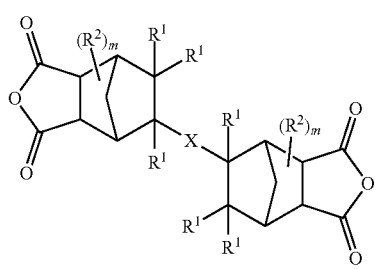

(1)

wherein, X is selected from the group consisting of a divalent aromatic hydrocarbon group having from 6 to 30 carbon atoms; the divalent aromatic hydrocarbon group represented by X may be substituted with a substituent, and the number of carbon atoms represents the number of carbon atoms forming an aromatic ring, a plurality of $R^1$s each independently represent at least one type selected from the group consisting of a hydrogen atom and an alkyl group having from 1 to 10 carbon atoms; a plurality of $R^2$s each independently represent a hydrogen atom or an alkyl group having from 1 to 10 carbon atoms; and m represents an integer from 0 to 4, and 6. The polyimide resin according to claim 5, wherein the structural unit B further comprises a structural unit B1 derived from at least one compound selected from the group consisting of a compound represented by formula:

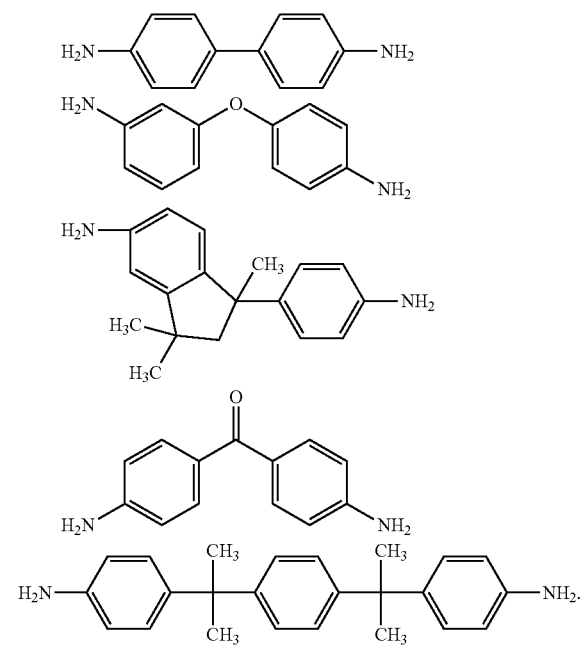

7. The polyimide resin according to claim 6, wherein 60 mol % or greater of the structural unit B1 or the structural unit B2 is comprised as the structural unit B.

8. The polyimide resin according to claim 5, wherein the structural unit B further comprises a structural unit B2 derived from at least one compound selected from the group consisting of a compound represented by formula:

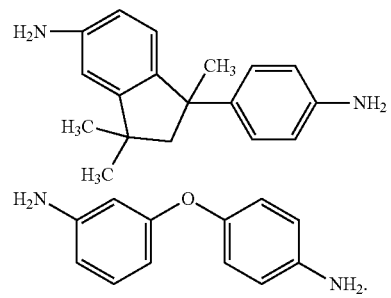

9. The polyimide resin according to claim 5, wherein a weight average molecular weight is 70000 or less.

10. A photosensitive resin composition comprising:
the polyimide resin according to claim 5; and
at least one (B) selected from the group consisting of a photopolymerization initiator, a solvent, and a photopolymerizable compound.

11. A polyimide varnish comprising:
the modified polyimide resin according to claim 1; and
an organic solvent.

12. A molded body formed by molding the polyimide varnish according to claim 11.

13. The molded body according to claim 12, wherein the molded body is in a membrane shape, a film shape, or a sheet shape.

14. A photosensitive resin composition comprising:
the modified polyimide resin (A) according to claim 1; and
at least one (B) selected from the group consisting of a photopolymerization initiator, a solvent, and a photopolymerizable compound.

15. The photosensitive resin composition according to claim 14, wherein the photopolymerizable compound comprises a polyfunctional radical polymerizable monomer.

16. The photosensitive resin composition according to claim 14, further comprising:
a sensitizer.

17. The photosensitive resin composition according to claim 14, wherein a residual film ratio of an unexposed portion is 40% or less, after exposure to light of a high-pressure mercury lamp excluding a wavelength of less than 365 nm under a condition of an exposure amount being from 1500 to 2500 mJ/cm$^2$.

18. The photosensitive resin composition according to claim 14, wherein the photosensitive resin composition is used for forming an insulating film.

19. A resin film comprising:
the photosensitive resin composition according to claim 14 or a cured product of the photosensitive resin composition.

20. The resin film according to claim 19, wherein a thickness of the film is from 10 to 85 μm.

21. An electronic device comprising:
the resin film according to claim 20.

22. A polyimide varnish comprising:
the polyimide resin according to claim 5; and
an organic solvent.

* * * * *